US011476167B2

(12) United States Patent
Kitazawa et al.

(10) Patent No.: US 11,476,167 B2
(45) Date of Patent: *Oct. 18, 2022

(54) HEAT TREATMENT METHOD AND HEAT TREATMENT APPARATUS OF LIGHT IRRADIATION TYPE

(71) Applicant: SCREEN HOLDINGS CO., LTD., Kyoto (JP)

(72) Inventors: Takahiro Kitazawa, Kyoto (JP); Mao Omori, Kyoto (JP); Kazuhiko Fuse, Kyoto (JP)

(73) Assignee: SCREEN HOLDINGS CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/910,163

(22) Filed: Mar. 2, 2018

(65) Prior Publication Data

US 2018/0254224 A1    Sep. 6, 2018

(30) Foreign Application Priority Data

Mar. 3, 2017   (JP) .............................. JP2017-040210
Dec. 8, 2017   (JP) .............................. JP2017-235948

(51) Int. Cl.
*H01L 21/66*  (2006.01)
*H01L 21/324*  (2006.01)
(Continued)

(52) U.S. Cl.
CPC .......... *H01L 22/12* (2013.01); *H01L 21/2686* (2013.01); *H01L 21/324* (2013.01);
(Continued)

(58) Field of Classification Search
None
See application file for complete search history.

(56) References Cited

U.S. PATENT DOCUMENTS

| 5,759,424 A | 6/1998 | Imatake et al. |
| 2004/0038455 A1* | 2/2004 | Seligson ................. G03F 7/705 438/122 |

(Continued)

FOREIGN PATENT DOCUMENTS

| CN | 1989596 A | 6/2007 |
| CN | 106104756 A | 11/2016 |

(Continued)

OTHER PUBLICATIONS

Taiwanese Office Action issued in corresponding Taiwanese Patent Application No. 107106076, dated Dec. 18, 2018, with English Translation of the Japanese Translation of the Taiwanese Office Action.

(Continued)

*Primary Examiner* — Anthony Ho
*Assistant Examiner* — Kevin Quinto
(74) *Attorney, Agent, or Firm* — McDermott Will & Emery LLP

(57) ABSTRACT

A front surface of a semiconductor wafer is rapidly heated by irradiation of a flash of light. Temperature of the front surface of the semiconductor wafer is measured at predetermined intervals after the irradiation of the flash of light, and is sequentially accumulated to acquire a temperature profile. From the temperature profile, an average value and a standard deviation are each calculated as a characteristic value. It is determined that the semiconductor wafer is cracked when an average value of the temperature profile deviates from the range of ±5σ from a total average of temperature profiles of a plurality of semiconductor wafers or when a standard deviation of the temperature profile deviates from the range of 5σ from the total average thereof of the plurality of semiconductor wafers.

10 Claims, 14 Drawing Sheets

(51) Int. Cl.
  *H01L 21/67* (2006.01)
  *H01L 21/268* (2006.01)
  *H01L 21/687* (2006.01)
  *H01L 21/677* (2006.01)

(52) U.S. Cl.
  CPC .. *H01L 21/67115* (2013.01); *H01L 21/67248* (2013.01); *H01L 21/67288* (2013.01); *H01L 21/6875* (2013.01); H01L 21/67017 (2013.01); H01L 21/67742 (2013.01); H01L 21/68785 (2013.01)

(56) References Cited

U.S. PATENT DOCUMENTS

| | | |
|---|---|---|
| 2008/0043806 A1 | 2/2008 | Murakami et al. |
| 2008/0226272 A1 | 9/2008 | Kasai et al. |
| 2012/0091110 A1 | 4/2012 | Kaneyama |
| 2012/0288970 A1 | 11/2012 | Hashimoto et al. |
| 2013/0259457 A1 | 10/2013 | Yokouchi et al. |
| 2014/0329340 A1 | 11/2014 | Yokouchi |
| 2015/0092814 A1* | 4/2015 | Wolfgruber ............... G01J 5/02 374/121 |
| 2016/0365293 A1 | 12/2016 | Ohtsuki et al. |
| 2017/0194177 A1 | 7/2017 | Cibere |
| 2021/0020472 A1* | 1/2021 | Omori ..................... H01L 22/12 |

FOREIGN PATENT DOCUMENTS

| | | |
|---|---|---|
| JP | 2005-340591 A | 12/2005 |
| JP | 2009-231697 A | 10/2009 |
| JP | 2012-238779 A | 12/2012 |
| JP | 2013-247128 A | 12/2013 |
| JP | 2015-130423 A | 7/2015 |
| KR | 0152355 B1 | 12/1998 |
| KR | 10-2007-0061418 A | 6/2007 |
| KR | 10-2008-0058488 A | 6/2008 |
| KR | 10-2012-0038886 A | 4/2012 |
| TW | 201324618 A | 6/2013 |
| WO | 2017/116687 A1 | 7/2017 |
| WO | WO-2017/116687 A1 * | 7/2017 |

OTHER PUBLICATIONS

Korean Notification of Reason for Refusal issued in corresponding Korean Patent Application No. 10-2018-0024533, dated Sep. 30, 2019, with English translation.
Korean Notice of Final Rejection issued in corresponding Korean Patent Application No. 10-2018-0024533, dated Apr. 29, 2020, with English translation.
Korean Notice of Final Rejection issued in corresponding Korean Patent Application No. 10-2018-0024533, dated Dec. 31, 2020, with English translation.
Korean Notification of Reason for Refusal issued in corresponding Korean Patent Application No. 10-2018-0024533, dated Jun. 29, 2020, with English translation.
Taiwanese Office Action issued in corresponding Taiwanese Patent Application No. 107106076, dated Oct. 23, 2019, with English Translation of the Japanese Translation of the Taiwanese Office Action.
Taiwanese Office Action issued in corresponding Taiwanese Patent Application No. 109138456, dated Mar. 19, 2021, with partial English Translation of the Japanese Translation of the Taiwanese Office Action.
Japanese Notice of Reasons for Refusal issued in corresponding Japanese Patent Application No. 2017-235948, dated Jun. 1, 2021, with English translation.
Taiwanese Office Action issued in corresponding Taiwanese Patent Application No. 109138456, dated Nov. 2, 2021, with English translation.
Japanese Decision of Refusal issued in corresponding Japanese Patent Application No. 2017-235948, dated Dec. 21, 2021, with English translation.
Korean Notification of Reason for Refusal issued in corresponding Korean Patent Application No. 10-2021-0041961, dated Jun. 30, 2021, with English translation.
Korean Decision of Grant issued in corresponding Korean Patent Application No. 10-2022-0006371, dated Aug. 1, 2022, with English translation.

* cited by examiner

F I G . 4
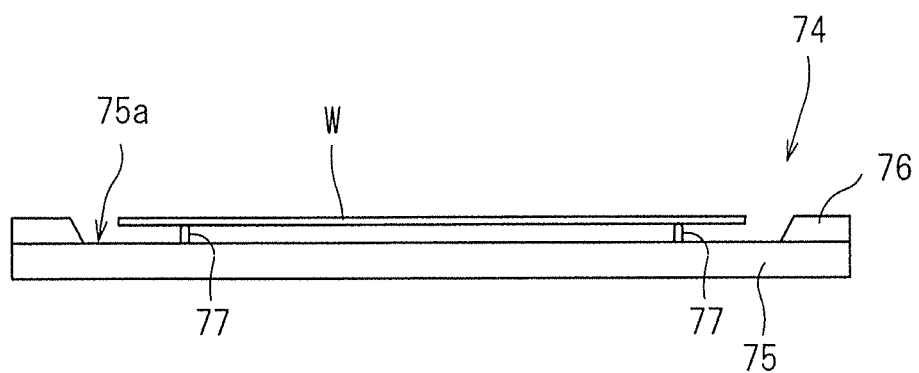

F I G . 6
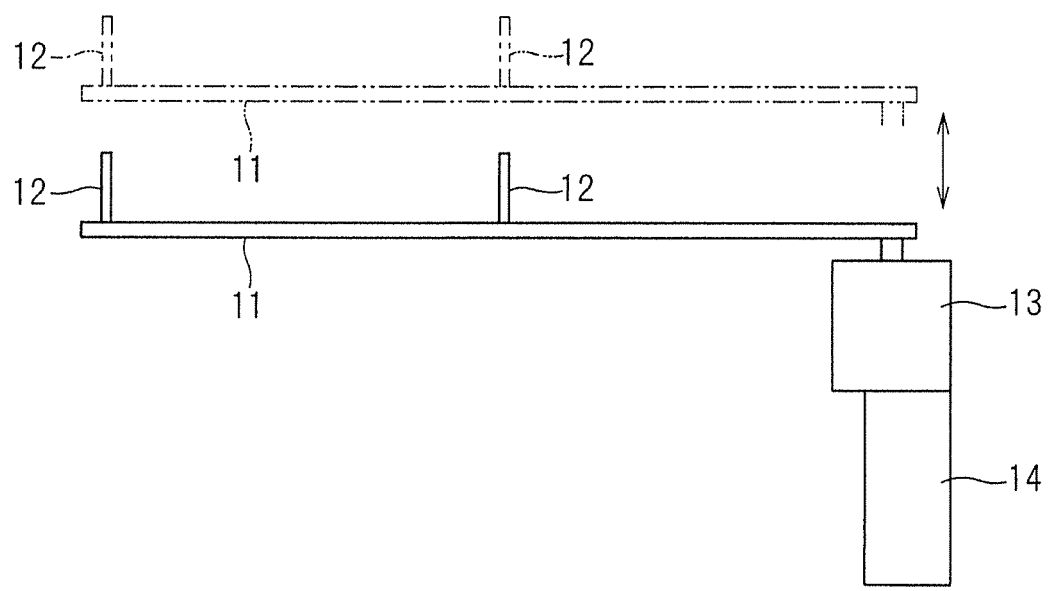

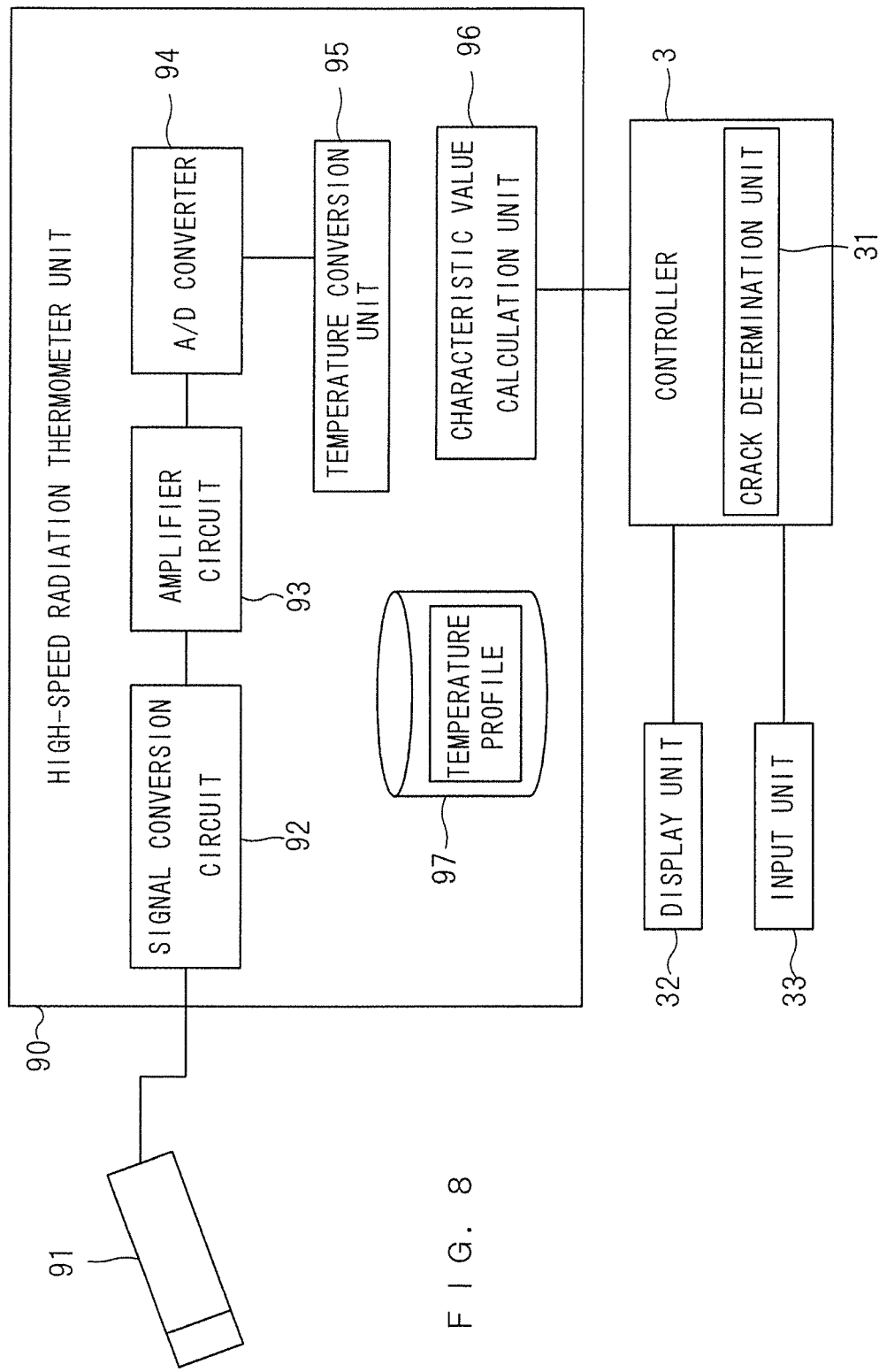
F I G. 8

F I G. 9
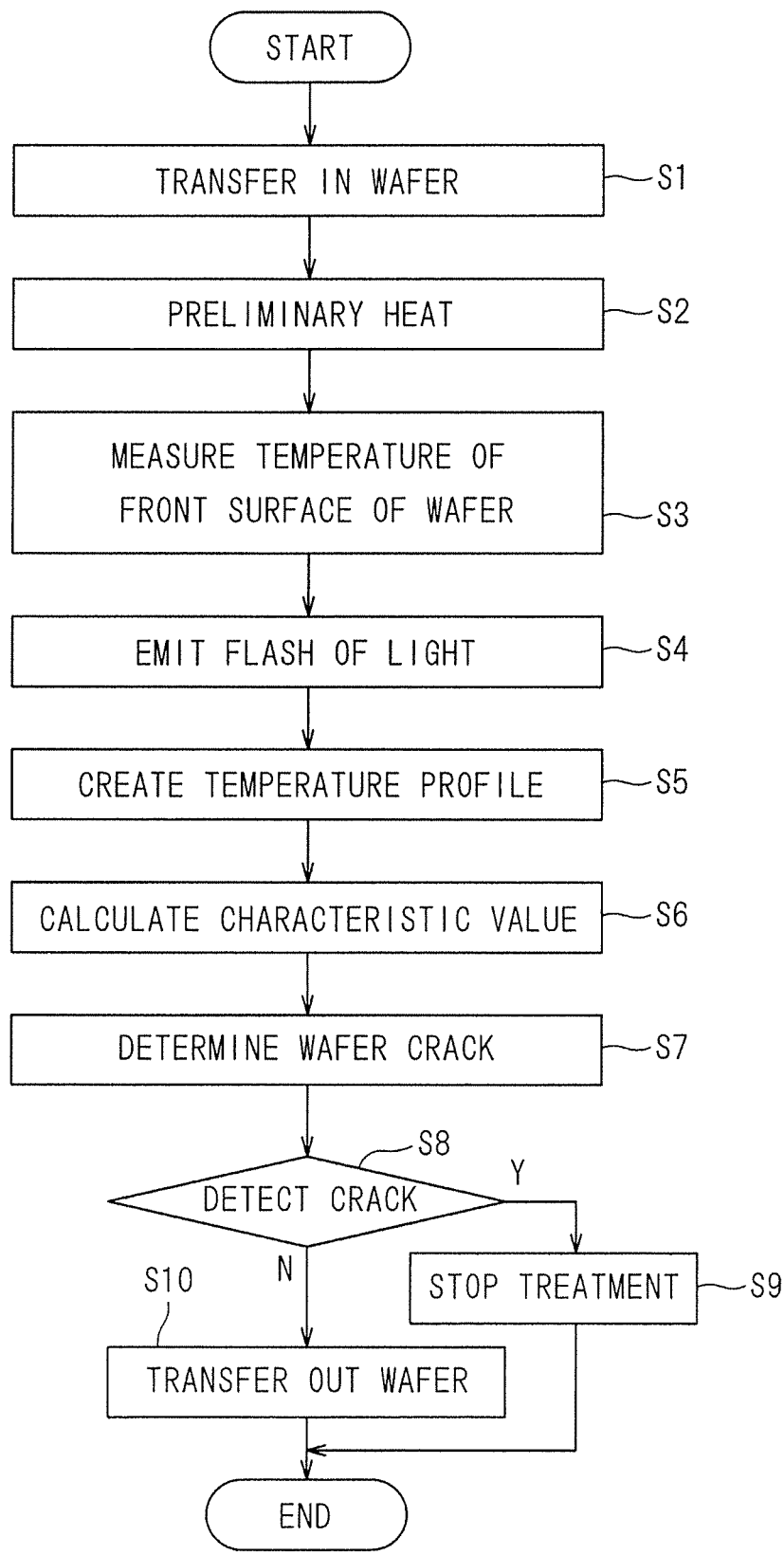

F I G . 1 2
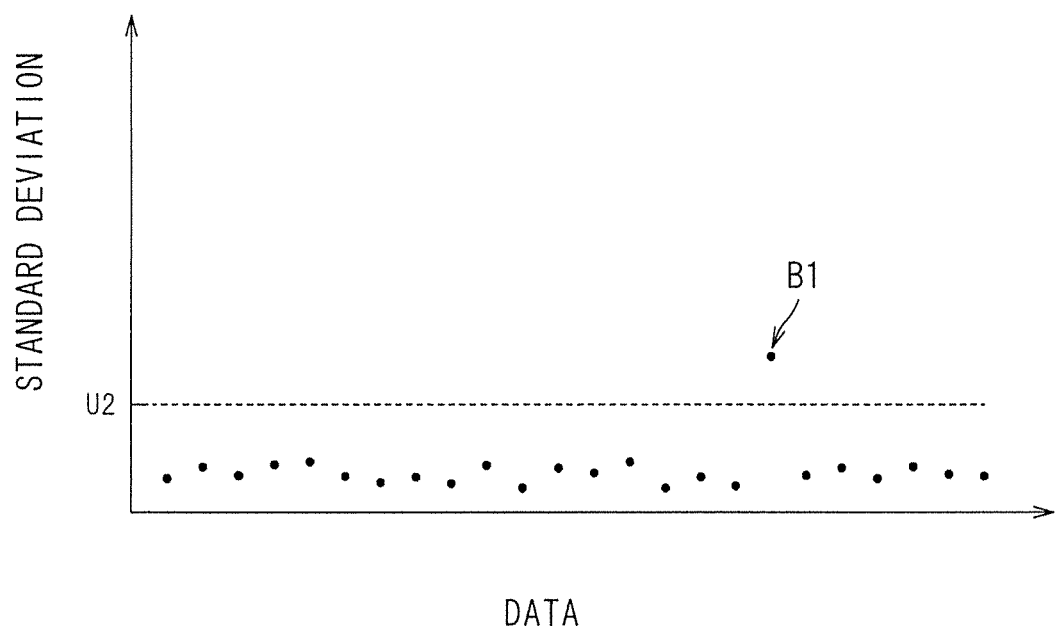

HEAT TREATMENT METHOD AND HEAT TREATMENT APPARATUS OF LIGHT IRRADIATION TYPE

BACKGROUND OF THE INVENTION

Field of the Invention

The present invention relates to a heat treatment method and a heat treatment apparatus, for irradiating a thin-plated precision electronic substrate (hereinafter referred to as simply "substrate") such as a semiconductor wafer with a flash of light to heat the substrate.

Description of the Background Art

In a manufacturing process of semiconductor devices, impurity doping is an essential process to form a p-n junction in a semiconductor wafer. At present, impurity doping is typically performed by an ion implantation method followed by an annealing method. The ion implantation method is a technique for physically performing impurity implantation by ionizing elements of impurities, such as boron (B), arsenic (As), and phosphorus (P), and colliding them with a semiconductor wafer by using highly accelerated voltage. The impurities implanted are activated by annealing treatment. At the time, when annealing time is about a few seconds or more, implanted impurities are deeply diffused by heat. As a result, junction depth becomes too deeper than the depth required, and this may hinder forming of a favorable device.

In recent years, flash lamp annealing (FLA) has been paid attention as an annealing technique for heating a semiconductor wafer for an extremely short time. The flash lamp annealing is a heat treatment technique for irradiating a front surface of a semiconductor wafer with a flash of light by using a xenon flash lamp (hereinafter when referred to as simply a "flash lamp", it means a xenon flash lamp) to increase temperature of only the front surface of a semiconductor wafer into which impurities are implanted in an extremely short time (milliseconds or less).

The xenon flash lamp has an emission spectroscopy distribution radiation from an ultraviolet part to a near-infrared part, and has a wavelength that is shorter than that of a conventional halogen lamp, and that almost coincides with that of a fundamental absorption band of a semiconductor wafer made of silicon. This causes transmitted light to decrease when the xenon flash lamp irradiates a semiconductor wafer with a flash of light, so that temperature of the semiconductor wafer can be sharply increased. It is also found that emission of a flash of light for an extremely short time of milliseconds or less enables only near a front surface of a semiconductor wafer to be selectively increased in temperature. Thus, when temperature rises for an extremely short time by a xenon flash lamp, only impurity activation can be performed without diffusing impurities deeply.

In a heat treatment apparatus using such a flash lamp, a front surface of a semiconductor wafer is instantaneously irradiated with a flash of light having extremely high energy, so that temperature of the front surface of the semiconductor wafer rapidly rises for a moment, while temperature of a back surface thereof does not rise so much. This causes abrupt thermal expansion only on the front surface of the semiconductor wafer, so that the semiconductor wafer is deformed so as to warp with its upper surface being convex. At the next moment, the semiconductor wafer is deformed so as to warp with its lower surface being convex in reaction.

When the semiconductor wafer is deformed so as to be convex on its upper surface, an end edge portion of the wafer collides with a susceptor. Conversely, when the semiconductor wafer is deformed so as to be convex on its lower surface, a center portion of the wafer collides with the susceptor. As a result, there is a problem that the semiconductor wafer is cracked due to impact of the collision with the susceptor.

When wafer cracking occurs during flash heating, it is necessary not only to quickly detect the crack to stop loading a succeeding semiconductor wafer, but also to clean the inside of a chamber. In addition, from a viewpoint of preventing an adverse effect such as particles caused by wafer cracking that scatter outside the chamber and adhere to a subsequent semiconductor wafer, it is preferable to detect a crack in a wafer in a chamber before a transfer inlet-outlet of the chamber immediately after flash heating is opened.

For this reason, Japanese Patent Application Laid-Open No. 2009-231697 discloses a technique for determining a wafer crack by providing a microphone in a chamber for performing a flash heating treatment to detect a sound when a semiconductor wafer is cracked, for example. In addition, Japanese Patent Application Laid-Open No. 2013-247128 discloses a technique for detecting a wafer crack by providing an optical sensor on a transfer path of semiconductor wafers to measure a contour shape of a semiconductor wafer. Further, Japanese Patent Application Laid-Open No. 2015-130423 discloses a technique for detecting a wafer crack from intensity of reflected light from a semiconductor wafer, received by a light guiding rod.

Unfortunately, the technique disclosed in Japanese Patent Application Laid-Open No. 2009-231697 has a problem that filtering for extracting only a sound of a semiconductor wafer when it is cracked is difficult. In addition, the technique disclosed in Japanese Patent Application Laid-Open No. 2013-247128 has a problem that a hand of a transport robot for transferring a semiconductor wafer is limited in shape. Further, according to the technique disclosed in Japanese Patent Application Laid-Open No. 2015-130423, a process of rotating the light guiding rod is required twice before and after irradiation of a flash of light, thereby causing a problem of deterioration in throughput.

SUMMARY

The present invention is directed to a heat treatment method for irradiating a substrate with a flash of light to heat the substrate.

In an aspect of the present invention, the heat treatment method includes the following steps: (a) irradiating a front surface of a substrate with a flash of light from a flash lamp; (b) acquiring a temperature profile by measuring temperature of the front surface of the substrate for a predetermined period after irradiation of the flash of light; and (c) detecting a crack of the substrate by analyzing the temperature profile.

It is possible to detect a crack of a substrate during irradiation of a flash of light with a simple structure.

In another aspect of the present invention, the heat treatment method includes the following steps: (a) irradiating a front surface of a substrate with a flash of light from a flash lamp; (b) acquiring a temperature profile by measuring temperature of the front surface of the substrate for a predetermined period after irradiation of the flash of light is started; and (c) detecting a crack of the substrate by analyzing the temperature profile.

It is possible to more reliably detect a crack of a substrate during irradiation of a flash of light.

It is preferable that an average value and a standard deviation of the temperature profile each serve as a characteristic value, and it is determined in the step (c) that a substrate is cracked when an average value of the temperature profile is out of a predetermined range, or a standard deviation of the temperature profile is out of a predetermined range.

It is possible to improve accuracy of crack determination.

The present invention is also directed to a heat treatment apparatus for irradiating a substrate with a flash of light to heat the substrate.

In an aspect of the present invention, a heat treatment apparatus includes: a chamber that houses a substrate; a flash lamp that irradiates a front surface of the substrate housed in the chamber with a flash of light; a radiation thermometer that measures temperature of the front surface of the substrate by receiving infrared light emitted from the front surface; a profile acquiring unit that acquires a temperature profile of temperature of the front surface of the substrate, measured by the radiation thermometer for a predetermined period after irradiation of a flash of light from the flash lamp; and an analyzing unit that analyzes the temperature profile to detect a crack of the substrate.

It is possible to detect a crack of a substrate during irradiation of a flash of light with a simple structure.

In another aspect of the present invention, a heat treatment apparatus includes: a chamber that houses a substrate; a flash lamp that irradiates a front surface of the substrate housed in the chamber with a flash of light; a radiation thermometer that measures temperature of the front surface of the substrate by receiving infrared light emitted from the front surface; a profile acquiring unit that acquires a temperature profile of temperature of the front surface of the substrate, measured by the radiation thermometer for a predetermined period after irradiation of a flash of light from the flash lamp is started; and an analyzing unit that analyzes the temperature profile to detect a crack of the substrate.

It is possible to more reliably detect a crack of a substrate during irradiation of a flash of light.

It is preferable that an average value and a standard deviation of the temperature profile each serve as the characteristic value, and the analyzing unit is configured to determine that a substrate is cracked when an average value of the temperature profile is out of a predetermined range, or a standard deviation of the temperature profile is out of a predetermined range.

It is possible to improve accuracy of crack determination.

Thus, it is an object of the present invention to detect a crack of a substrate during irradiation of a flash of light with a simple structure.

These and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a sectional view of the susceptor;

FIG. 6 is a side view of the transfer mechanism;

FIG. 8 is a block diagram showing a configuration of a high-speed radiation thermometer unit including a main part of an upper radiation thermometer;

FIG. 9 is a flowchart showing a treatment procedure of a semiconductor wafer;

FIG. 12 is a graph for explaining crack determination based on a standard deviation of a temperature profile;

DESCRIPTION OF THE PREFERRED EMBODIMENTS

Preferred embodiments according to the present invention will now be described in detail with reference to the drawings.

First Preferred Embodiment

Figure 1:
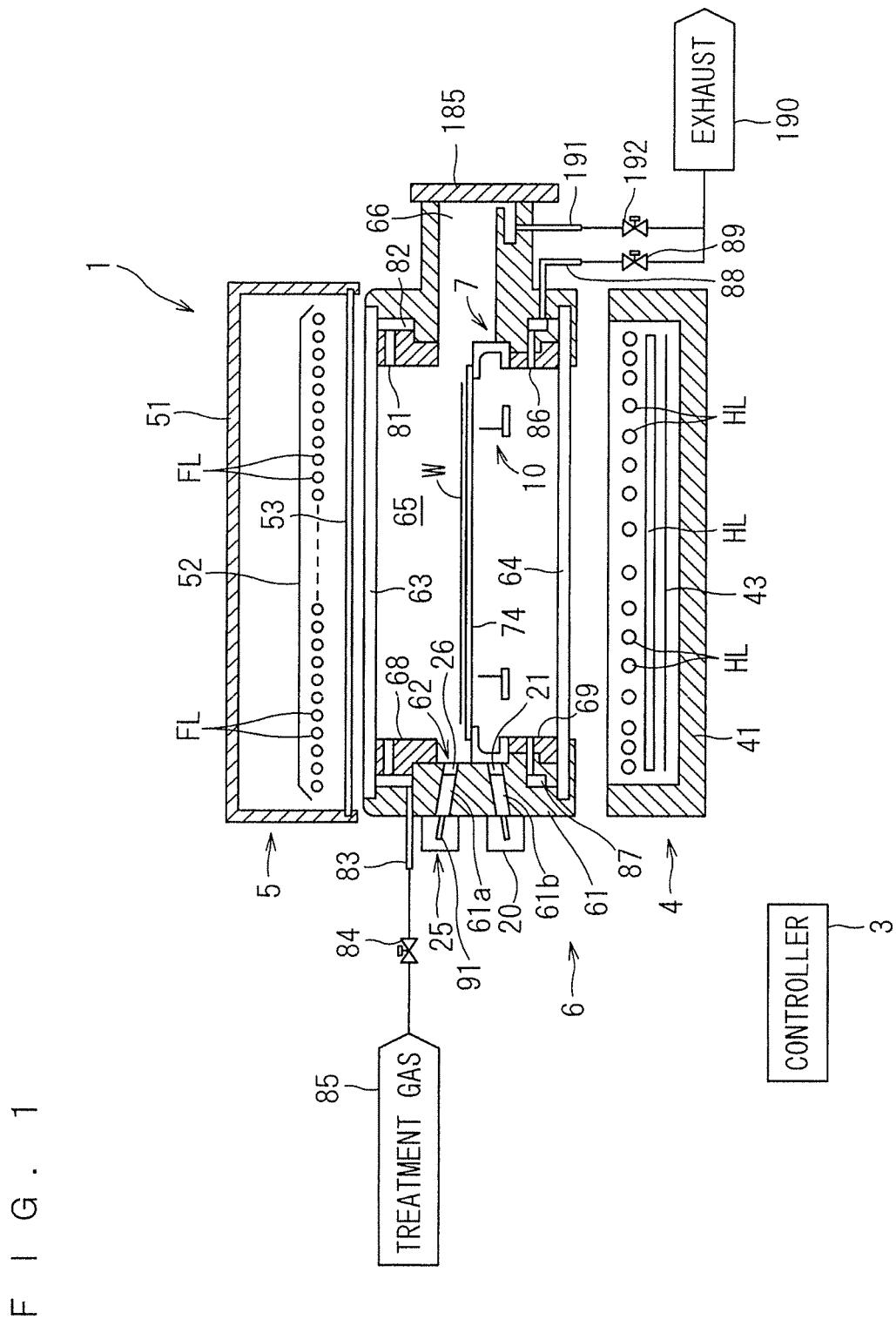
FIG. 1 is a longitudinal sectional view showing a configuration of a heat treatment apparatus according to the present invention.

FIG. 1 is a longitudinal sectional view showing a configuration of a heat treatment apparatus 1 according to the present invention. The heat treatment apparatus 1 of FIG. 1 is a flash lamp annealer for irradiating a disk-shaped semiconductor wafer W serving as a substrate with flashes of light to heat the semiconductor wafer W. The size of the semiconductor wafer W to be treated is not particularly limited. For example, the semiconductor wafer W to be treated has a diameter of 300 mm or 450 mm (300 mm in the present preferred embodiment). Impurities are implanted into a semiconductor wafer W before transferred into the heat treatment apparatus 1, and activation treatment for the implanted impurities is performed by heat treatment by the heat treatment apparatus 1. It should be noted that the dimensions of components and the number of components are shown in exaggeration or in simplified form, as appropriate, in FIG. 1 and the subsequent drawings for the sake of easier understanding.

The heat treatment apparatus 1 includes a chamber 6 for receiving a semiconductor wafer W therein, a flash heating part 5 including a plurality of built-in flash lamps FL, and a halogen heating part 4 including a plurality of built-in halogen lamps HL. The flash heating part 5 is provided over the chamber 6, and the halogen heating part 4 is provided under the chamber 6. The heat treatment apparatus 1 further includes a holder 7 provided inside the chamber 6 and for holding a semiconductor wafer W in a horizontal attitude, and a transfer mechanism 10 provided inside the chamber 6 and for transferring a semiconductor wafer W between the holder 7 and the outside of the heat treatment apparatus 1. The heat treatment apparatus 1 further includes a controller 3 for controlling operating mechanisms provided in the halogen heating part 4, the flash heating part 5, and the chamber 6 to cause the operating mechanisms to heat-treat a semiconductor wafer W.

The chamber 6 is configured such that upper and lower chamber windows 63 and 64 made of quartz are mounted to the top and bottom, respectively, of a tubular chamber side portion 61. The chamber side portion 61 has a generally tubular shape having an open top and an open bottom. The upper chamber window 63 is mounted to block the top opening of the chamber side portion 61, and the lower chamber window 64 is mounted to block the bottom opening thereof. The upper chamber window 63 forming the ceiling of the chamber 6 is a disk-shaped member made of quartz, and serves as a quartz window that transmits flashes of light emitted from the flash heating part 5 therethrough into the chamber 6. The lower chamber window 64 forming the floor of the chamber 6 is also a disk-shaped member made of quartz, and serves as a quartz window that transmits light emitted from the halogen heating part 4 therethrough into the chamber 6.

An upper reflective ring 68 is mounted to an upper portion of the inner wall surface of the chamber side portion 61, and a lower reflective ring 69 is mounted to a lower portion thereof. Both of the upper and lower reflective rings 68 and 69 are in the form of an annular ring. The upper reflective ring 68 is mounted by being inserted downwardly from the top of the chamber side portion 61. The lower reflective ring 69, on the other hand, is mounted by being inserted upwardly from the bottom of the chamber side portion 61 and fastened with screws not shown. In other words, the upper and lower reflective rings 68 and 69 are removably mounted to the chamber side portion 61. An interior space of the chamber 6, i.e. a space surrounded by the upper chamber window 63, the lower chamber window 64, the chamber side portion 61, and the upper and lower reflective rings 68 and 69, is defined as a heat treatment space 65.

A recessed portion 62 is defined in the inner wall surface of the chamber 6 by mounting the upper and lower reflective rings 68 and 69 to the chamber side portion 61. Specifically, the recessed portion 62 is defined which is surrounded by a middle portion of the inner wall surface of the chamber side portion 61 where the reflective rings 68 and 69 are not mounted, a lower end surface of the upper reflective ring 68, and an upper end surface of the lower reflective ring 69. The recessed portion 62 is provided in the form of a horizontal annular ring in the inner wall surface of the chamber 6, and surrounds the holder 7 which holds a semiconductor wafer W. The chamber side portion 61 and the upper and lower reflective rings 68 and 69 are made of a metal material (e.g., stainless steel) with high strength and high heat resistance.

The chamber side portion 61 is provided with a transport opening (throat) 66 for the transfer of a semiconductor wafer W therethrough into and out of the chamber 6. The transport opening 66 is openable and closable by a gate valve 185. The transport opening 66 is connected in communication with an outer peripheral surface of the recessed portion 62. Thus, when the transport opening 66 is opened by the gate valve 185, a semiconductor wafer W is allowed to be transferred through the transport opening 66 and the recessed portion 62 into and out of the heat treatment space 65. When the transport opening 66 is closed by the gate valve 185, the heat treatment space 65 in the chamber 6 is an enclosed space.

In addition, the chamber side portion 61 is provided with a through hole 61a and a through hole 61b. The through hole 61a is a cylindrical hole for guiding infrared light to an infrared sensor 91 of an upper radiation thermometer 25, the infrared light being emitted from an upper surface of a semiconductor wafer W held by a susceptor 74 described later. On the other hand, the through hole 61b is a cylindrical hole for guiding infrared light emitted from a lower surface of a semiconductor wafer W to a lower radiation thermometer 20. The through hole 61a and the through hole 61b are provided to be inclined with respect to a horizontal direction such that an axis of each of the through holes in their penetrating direction intersects with a main surface of a semiconductor wafer W held by the susceptor 74. The through hole 61a is provided at its end facing the heat treatment space 65 with a transparent window 26 made of a calcium fluoride material that allows infrared light in a wavelength range measurable by the upper radiation thermometer 25 to pass therethrough. In addition, the through hole 61b is provided at its end facing the heat treatment space 65 with a transparent window 21 made of a barium fluoride material that allows infrared light in a wavelength range measurable by the lower radiation thermometer 20 to pass therethrough.

At least one gas supply opening 81 for supplying a treatment gas therethrough into the heat treatment space 65 is provided in an upper portion of the inner wall of the chamber 6. The gas supply opening 81 is provided above the recessed portion 62, and may be provided in the upper reflective ring 68. The gas supply opening 81 is connected in communication with a gas supply pipe 83 through a buffer space 82 provided in the form of an annular ring inside the side wall of the chamber 6. The gas supply pipe 83 is connected to a treatment gas supply source 85. A valve 84 is inserted at some midpoint in the gas supply pipe 83. When the valve 84 is opened, the treatment gas is fed from the treatment gas supply source 85 to the buffer space 82. The treatment gas flowing in the buffer space 82 flows in a spreading manner within the buffer space 82 which is lower in fluid resistance than the gas supply opening 81, and is supplied through the gas supply opening 81 into the heat treatment space 65. Examples of the treatment gas usable herein include inert gases such as nitrogen gas ($N_2$), reactive gases such as hydrogen ($H_2$) and ammonia ($NH_3$), and mixtures of these gases (although nitrogen gas is used in this preferred embodiment).

At least one gas exhaust opening 86 for exhausting a gas from the heat treatment space 65 is provided in a lower portion of the inner wall of the chamber 6. The gas exhaust opening 86 is provided below the recessed portion 62, and may be provided in the lower reflective ring 69. The gas exhaust opening 86 is connected in communication with a gas exhaust pipe 88 through a buffer space 87 provided in the form of an annular ring inside the side wall of the chamber 6. The gas exhaust pipe 88 is connected to an exhaust part 190. A valve 89 is inserted at some midpoint in the gas exhaust pipe 88. When the valve 89 is opened, the gas in the heat treatment space 65 is exhausted through the gas exhaust opening 86 and the buffer space 87 to the gas exhaust pipe 88. The at least one gas supply opening 81 and the at least one gas exhaust opening 86 may include a plurality of gas supply openings 81 and a plurality of gas exhaust openings 86, respectively, arranged in a circumferential direction of the chamber 6, and may be in the form of slits. The treatment gas supply source 85 and the exhaust part 190 each may be a mechanism provided in the heat treatment apparatus 1, or a utility system of a factory in which the heat treatment apparatus 1 is installed.

A gas exhaust pipe 191 for exhausting the gas from the heat treatment space 65 is also connected to a distal end of the transport opening 66. The gas exhaust pipe 191 is connected through a valve 192 to the exhaust part 190. By opening the valve 192, the gas in the chamber 6 is exhausted through the transport opening 66.

Figure 2:
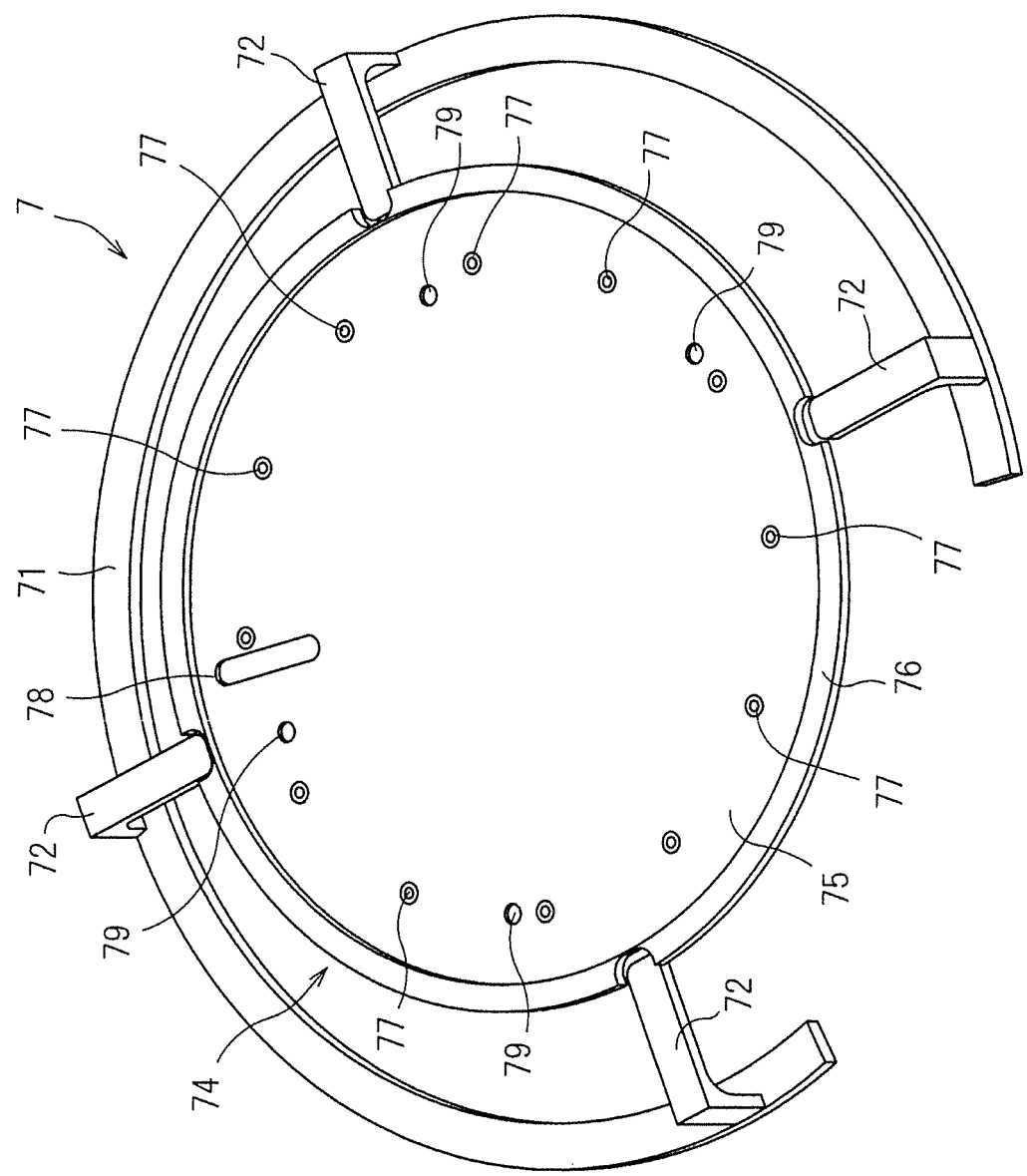
FIG. 2 is a perspective view showing the entire external appearance of a holder.

FIG. 2 is a perspective view showing the entire external appearance of the holder 7. The holder 7 includes a base ring 71, coupling portions 72, and a susceptor 74. The base ring 71, the coupling portions 72, and the susceptor 74 are all made of quartz. In other words, the whole of the holder 7 is made of quartz.

The base ring 71 is a quartz member having an arcuate shape obtained by removing a portion from an annular shape. This removed portion is provided to prevent interference between transfer arms 11 of the transfer mechanism 10 to be described later and the base ring 71. The base ring 71 is supported by the wall surface of the chamber 6 by being placed on the bottom surface of the recessed portion 62 (with reference to FIG. 1). The multiple coupling portions 72 (in the present preferred embodiment, four coupling portions 72) are mounted upright on the upper surface of the base ring 71 and arranged in a circumferential direction of the annular shape thereof. The coupling portions 72 are quartz members, and are rigidly secured to the base ring 71 by welding.

Figure 3:
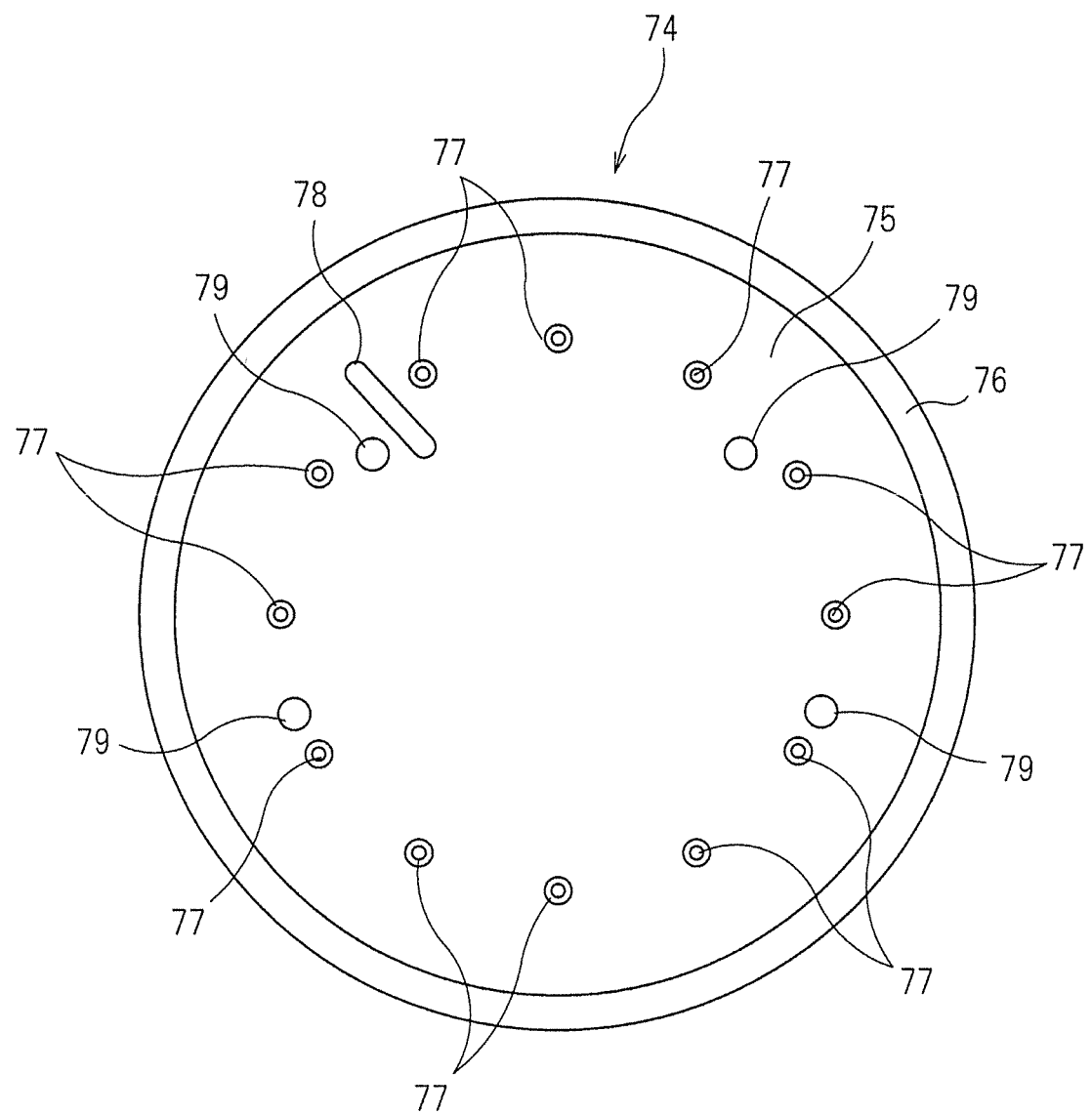
FIG. 3 is a plan view of a susceptor.

The susceptor 74 is supported by the four coupling portions 72 provided on the base ring 71. FIG. 3 is a plan view of the susceptor 74. FIG. 4 is a sectional view of the susceptor 74. The susceptor 74 includes a holding plate 75, a guide ring 76, and a plurality of substrate support pins 77. The holding plate 75 is a generally circular planar member made of quartz. The diameter of the holding plate 75 is greater than that of a semiconductor wafer W. In other words, the holding plate 75 has a size, as seen in plan view, greater than that of the semiconductor wafer W.

The guide ring 76 is provided on a peripheral portion of the upper surface of the holding plate 75. The guide ring 76 is an annular member having an inner diameter greater than the diameter of the semiconductor wafer W. For example, when the diameter of the semiconductor wafer W is 300 mm, the inner diameter of the guide ring 76 is 320 mm. The inner periphery of the guide ring 76 is in the form of a tapered surface which becomes wider in an upward direction from the holding plate 75. The guide ring 76 is made of quartz similar to that of the holding plate 75. The guide ring 76 may be welded to the upper surface of the holding plate 75 or fixed to the holding plate 75 with separately machined pins and the like. Alternatively, the holding plate 75 and the guide ring 76 may be machined as an integral member.

A region of the upper surface of the holding plate 75 which is inside the guide ring 76 serves as a planar holding surface 75a for holding the semiconductor wafer W. The substrate support pins 77 are provided upright on the holding surface 75a of the holding plate 75. In the present preferred embodiment, a total of 12 substrate support pins 77 are spaced at intervals of 30 degrees along the circumference of a circle concentric with the outer circumference of the holding surface 75a (the inner circumference of the guide ring 76). The diameter of the circle on which the 12 substrate support pins 77 are disposed (the distance between opposed ones of the substrate support pins 77) is slightly smaller than the diameter of the semiconductor wafer W, and is 270 to 280 mm (in the present preferred embodiment, 270 mm) when the diameter of the semiconductor wafer W is 300 mm. Each of the substrate support pins 77 is made of quartz. The substrate support pins 77 may be provided by welding on the upper surface of the holding plate 75 or machined integrally with the holding plate 75.

Referring again to FIG. 2, the four coupling portions 72 provided upright on the base ring 71 and the peripheral portion of the holding plate 75 of the susceptor 74 are rigidly secured to each other by welding. In other words, the susceptor 74 and the base ring 71 are fixedly coupled to each other with the coupling portions 72. The base ring 71 of such a holder 7 is supported by the wall surface of the chamber 6, whereby the holder 7 is mounted to the chamber 6. With the holder 7 mounted to the chamber 6, the holding plate 75 of the susceptor 74 assumes a horizontal attitude (an attitude such that the normal to the susceptor 74 coincides with a vertical direction). In other words, the holding surface 75a of the holding plate 75 becomes a horizontal surface.

A semiconductor wafer W transferred into the chamber 6 is placed and held in a horizontal attitude on the susceptor 74 of the holder 7 mounted to the chamber 6. At this time, the semiconductor wafer W is supported by the 12 substrate support pins 77 provided upright on the holding plate 75, and is held by the susceptor 74. More strictly speaking, the respective upper ends of the 12 substrate support pins 77 come in contact with the lower surface of the semiconductor wafer W to support the semiconductor wafer W. The semiconductor wafer W is supported in a horizontal attitude by the 12 substrate support pins 77 because the 12 substrate support pins 77 have a uniform height (distance from the upper ends of the substrate support pins 77 to the holding surface 75a of the holding plate 75).

The semiconductor wafer W supported by the substrate support pins 77 is spaced a predetermined distance apart from the holding surface 75a of the holding plate 75. The thickness of the guide ring 76 is greater than the height of the substrate support pins 77. Thus, the guide ring 76 prevents the horizontal misregistration of the semiconductor wafer W supported by the substrate support pins 77.

As shown in FIGS. 2 and 3, an opening 78 is provided in the holding plate 75 of the susceptor 74 so as to extend vertically through the holding plate 75 of the susceptor 74. The opening 78 is provided for allowing the lower radiation thermometer 20 to receive radiation light (infrared light) emitted from a lower surface of a semiconductor wafer W. That is, the lower radiation thermometer 20 receives light emitted from a lower surface of a semiconductor wafer W through the opening 78 and the transparent window 21 mounted in the through hole 61b of the chamber side portion 61 to measure temperature of the semiconductor wafer W. In addition, the holding plate 75 of the susceptor 74 further includes four through holes 79 bored therein and designed so that lift pins 12 of the transfer mechanism 10 to be described later pass through the through holes 79, respectively, to transfer a semiconductor wafer W.

Figure 5:
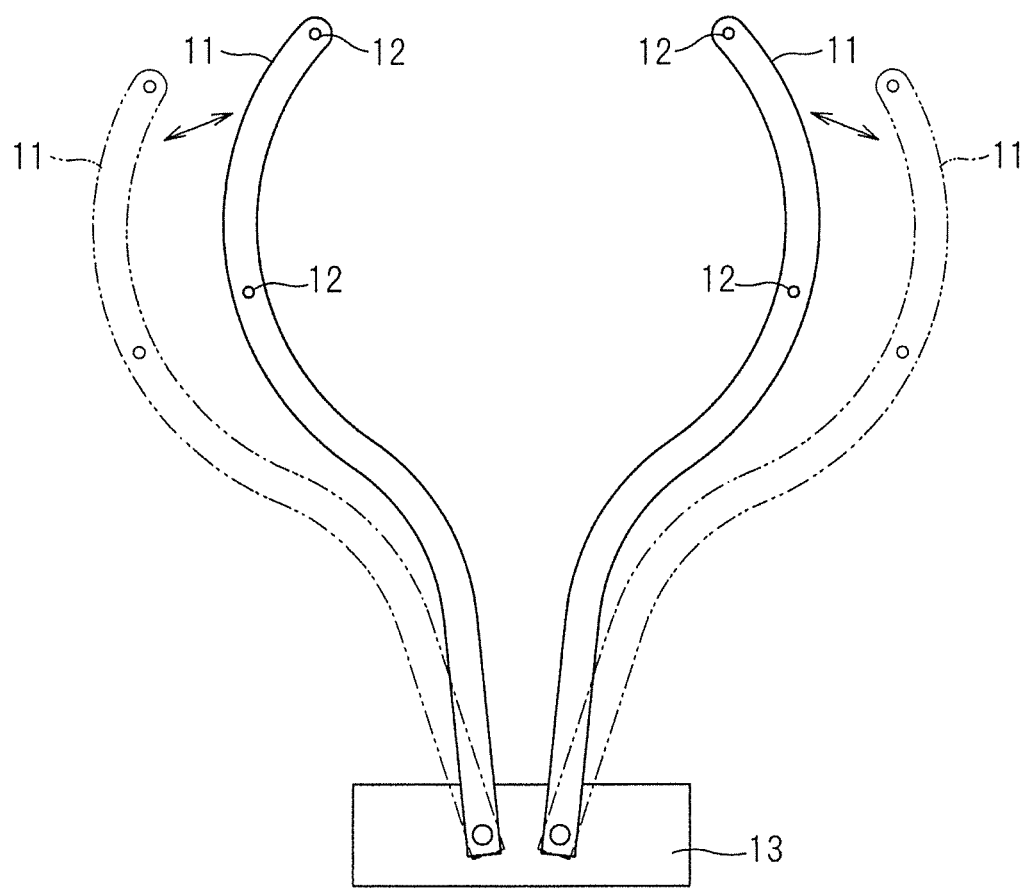
FIG. 5 is a plan view of a transfer mechanism.

FIG. 5 is a plan view of a transfer mechanism 10. FIG. 6 is a side view of the transfer mechanism 10. The transfer mechanism 10 includes the two transfer arms 11. The transfer arms 11 are of an arcuate configuration extending substantially along the annular recessed portion 62. Each of the transfer arms 11 includes the two lift pins 12 mounted upright thereon. The transfer arm 11 and the lift pin 12 are made of quartz. The transfer arms 11 are pivotable by a horizontal movement mechanism 13. The horizontal movement mechanism 13 moves the pair of transfer arms 11 horizontally between a transfer operation position (a position indicated by solid lines in FIG. 5) in which a semiconductor wafer W is transferred to and from the holder 7 and a retracted position (a position indicated by dash-double-dot lines in FIG. 5) in which the transfer arms 11 do not overlap the semiconductor wafer W held by the holder 7 as seen in plan view. The horizontal movement mechanism 13 may be of the type which causes individual motors to pivot the transfer arms 11 respectively or of the type which uses a linkage mechanism to cause a single motor to pivot the pair of transfer arms 11 in cooperative relation.

The pair of transfer arms 11 is moved upwardly and downwardly together with the horizontal movement mechanism 13 by an elevating mechanism 14. As the elevating mechanism 14 moves up the pair of transfer arms 11 at their transfer operation position, the four lift pins 12 in total pass through the respective four through holes 79 (with reference to FIGS. 2 and 3) bored in the susceptor 74 so that the upper ends of the lift pins 12 protrude from the upper surface of the susceptor 74. Meanwhile, as the elevating mechanism 14 moves down the pair of transfer arms 11 at their transfer operation position to take the lift pins 12 out of the respective through holes 79 and the horizontal movement mechanism 13 moves the pair of transfer arms 11 so as to open the transfer arms 11, the transfer arms 11 move to their retracted position. The retracted position of the pair of transfer arms 11 is immediately over the base ring 71 of the holder 7. The retracted position of the transfer arms 11 is inside the recessed portion 62 because the base ring 71 is placed on the bottom surface of the recessed portion 62. An exhaust mechanism (not shown) is also provided near the location where the drivers (the horizontal movement mechanism 13 and the elevating mechanism 14) of the transfer mechanism 10 are provided, and is configured to exhaust an atmosphere around the drivers of the transfer mechanism 10 to the outside of the chamber 6.

Referring again to FIG. 1, the flash heating part 5 provided over the chamber 6 includes an enclosure 51, a light source provided inside the enclosure 51 and including the multiple (in the present preferred embodiment, 30) xenon flash lamps FL, and a reflector 52 provided inside the enclosure 51 so as to cover the light source from above. The flash heating part 5 further includes a lamp light radiation window 53 mounted to the bottom of the enclosure 51. The lamp light radiation window 53 forming the floor of the flash heating part 5 is a plate-like quartz window made of quartz. The flash heating part 5 is provided over the chamber 6, whereby the lamp light radiation window 53 is opposed to the upper chamber window 63. The flash lamps FL direct flashes of light from over the chamber 6 through the lamp light radiation window 53 and the upper chamber window 63 toward the heat treatment space 65.

The flash lamps FL, each of which is a rod-shaped lamp having an elongated cylindrical shape, are arranged in a plane so that the longitudinal directions of the respective flash lamps FL are in parallel with each other along a main surface of a semiconductor wafer W held by the holder 7 (that is, in a horizontal direction). Thus, a plane defined by the arrangement of the flash lamps FL is also a horizontal plane.

The xenon flash lamp FL includes a rod-shaped glass tube (discharge tube) containing xenon gas sealed therein and having positive and negative electrodes provided on opposite ends thereof, the electrodes being connected to a capacitor, and a trigger electrode attached to the outer peripheral surface of the glass tube. A xenon gas is electrically insulated, so that no electricity flows in the glass tube in a normal state even if electric charges are accumulated in the capacitor. However, when high voltage is applied to the trigger electrode to produce an electrical breakdown, electricity accumulated in the capacitor flows momentarily in the glass tube, and then xenon atoms or molecules are excited to cause light emission. In the xenon flash lamp FL as described above, electrostatic energy preliminarily accumulated in the capacitor is converted into an extremely short optical pulse of 0.1 milliseconds to 100 milliseconds, so that it has a feature capable of emitting extremely intensive light as compared with a light source of continuous lighting like the halogen lamp HL. That is, the flash lamp FL is a pulse emission lamp that instantaneously emits light in an extremely short time of less than one second. The flash lamp FL has a light emission time that can be adjusted by changing a coil constant of a lamp power source that supplies electric power to the flash lamp FL.

The reflector 52 is provided over the plurality of flash lamps FL so as to cover all of the flash lamps FL. A fundamental function of the reflector 52 is to reflect flashes of light emitted from the plurality of flash lamps FL toward the heat treatment space 65. The reflector 52 is a plate made of an aluminum alloy, and has a front surface (a surface facing the flash lamps FL) that is roughened by abrasive blasting.

The halogen heating part 4 provided under the chamber 6 includes an enclosure 41 incorporating the multiple (in the present preferred embodiment, 40) halogen lamps HL. The halogen heating part 4 is a light irradiator that directs light from under the chamber 6 through the lower chamber window 64 toward the heat treatment space 65 to heat the semiconductor wafer W by means of the halogen lamps HL.

Figure 7:
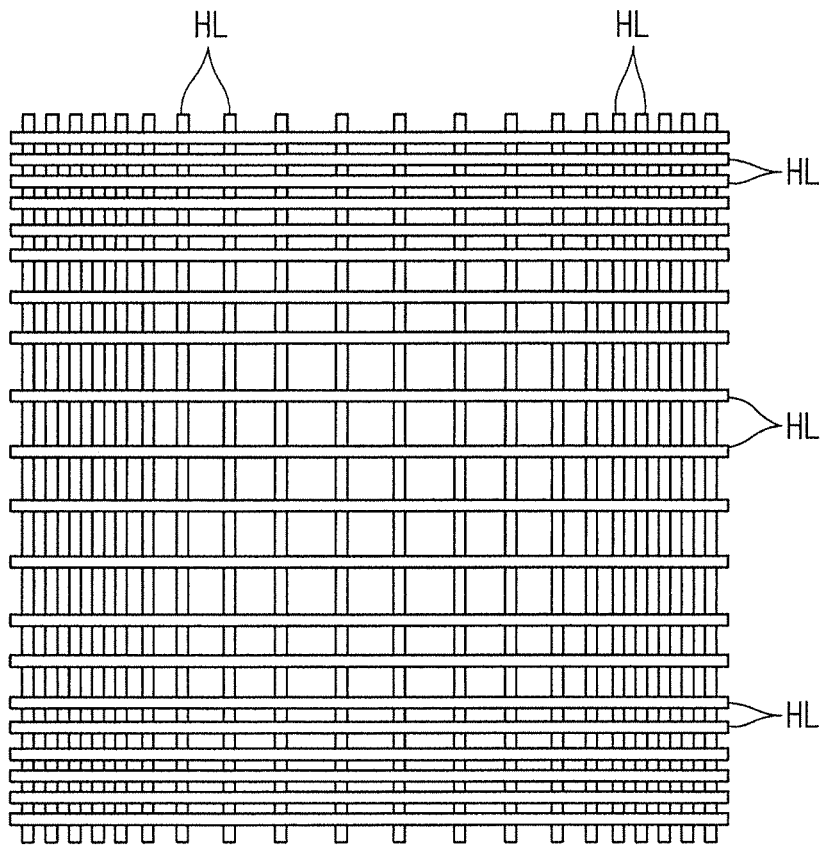
FIG. 7 is a plan view showing an arrangement of halogen lamps.

FIG. 7 is a plan view showing an arrangement of the multiple halogen lamps HL. The 40 halogen lamps HL are arranged in two tiers, i.e. upper and lower tiers. That is, 20 halogen lamps HL are arranged in the upper tier closer to the holder 7, and 20 halogen lamps HL are arranged in the lower tier farther from the holder 7 than the upper tier. Each of the halogen lamps HL is a rod-shaped lamp having an elongated cylindrical shape. The 20 halogen lamps HL in the upper tier and the 20 halogen lamps HL in the lower tier are arranged so that the longitudinal directions thereof are in parallel with each other along a main surface of a semiconductor wafer W held by the holder 7 (that is, in a horizontal direction). Thus, a plane defined by the arrangement of the halogen lamps HL in each of the upper and lower tiers is also a horizontal surface.

As shown in FIG. 7, the halogen lamps HL in each of the upper and lower tiers are disposed at a higher density in a region opposed to the peripheral portion of the semiconductor wafer W held by the holder 7 than in a region opposed to the central portion thereof. In other words, the halogen lamps HL in each of the upper and lower tiers are arranged at shorter intervals in the peripheral portion of the lamp arrangement than in the central portion thereof. This allows a greater amount of light to impinge upon the peripheral portion of the semiconductor wafer W where a temperature decrease is prone to occur when the semiconductor wafer W is heated by the irradiation thereof with light from the halogen heating part 4.

The group of halogen lamps HL in the upper tier and the group of halogen lamps HL in the lower tier are arranged to intersect each other in a lattice pattern. In other words, the 40 halogen lamps HL in total are disposed so that the longitudinal direction of the 20 halogen lamps HL arranged in the upper tier and the longitudinal direction of the 20 halogen lamps HL arranged in the lower tier are orthogonal to each other.

Each of the halogen lamps HL is a filament-type light source which passes current through a filament disposed in a glass tube to make the filament incandescent, thereby emitting light. A gas prepared by injecting a halogen element (iodine, bromine, and the like) in trace amounts into an inert gas such as nitrogen, argon, and the like is sealed in the glass tube. The introduction of the halogen element allows the temperature of the filament to be set at a high temperature while suppressing a break in the filament. Thus, the halogen lamps HL have the properties of having a longer life than typical incandescent lamps and being capable of continuously emitting intense light. That is, the halogen lamps HL are continuous lighting lamps that continuously emit light for not less than one second. In addition, the halogen lamps HL, which are rod-shaped lamps, have a long life. The arrangement of the halogen lamps HL in a horizontal direction provides good efficiency of radiation toward the semiconductor wafer W provided over the halogen lamps HL.

A reflector 43 is provided also inside the enclosure 41 of the halogen heating part 4 under the halogen lamps HL arranged in two tiers (with reference to FIG. 1). The reflector 43 reflects the light emitted from the halogen lamps HL toward the heat treatment space 65.

The controller 3 controls the aforementioned various operating mechanisms provided in the heat treatment apparatus 1. The controller 3 is similar in hardware configuration to a typical computer. Specifically, the controller 3 includes a CPU that is a circuit for performing various computation processes, a ROM or read-only memory for storing a basic program therein, a RAM or readable/writable memory for storing various pieces of information therein, and a magnetic disk for storing control software, data and the like therein. The CPU in the controller 3 executes a predetermined processing program, whereby the treatment in the heat treatment apparatus 1 proceed.

As shown in FIG. 1, the heat treatment apparatus 1 further includes an upper radiation thermometer 25 and a lower radiation thermometer 20. The upper radiation thermometer 25 is a high-speed radiation thermometer for measuring a sudden temperature change on an upper surface of a semiconductor wafer W at the moment when a flash of light is emitted from the flash lamp FL.

FIG. 8 is a block diagram showing a configuration of a high-speed radiation thermometer unit 90 including a main part of the upper radiation thermometer 25. The infrared sensor 91 of the upper radiation thermometer 25 is mounted on an outer wall surface of the chamber side portion 61 such that its optical axis coincides with the axis of the through hole 61a in the penetration direction. The infrared sensor 91 receives infrared light emitted from an upper surface of a semiconductor wafer W held by the susceptor 74 through the transparent window 26 made of calcium fluoride. The infrared sensor 91 has an optical element made of indium antimony (InSb), and its measurement wavelength range is 5 µm to 6.5 µm. The transparent window 26 made of calcium fluoride selectively transmits infrared light in the measurement wavelength range of the infrared sensor 91. The InSb optical element varies in resistance according to intensity of the received infrared light. The infrared sensor 91 provided with an InSb optical element is capable of high-speed measurement in which the response time is extremely short and the sampling interval is remarkably short (e.g., about 40 microseconds). The infrared sensor 91 is electrically connected to the high-speed radiation thermometer unit 90 to transmit a signal, generated in response to receiving of light, to the high-speed radiation thermometer unit 90.

The high-speed radiation thermometer unit 90 includes a signal conversion circuit 92, an amplifier circuit 93, an A/D converter 94, a temperature conversion unit 95, a characteristic value calculation unit 96, and a storage unit 97. The signal conversion circuit 92 converts a resistance change generated in the InSb optical element of the infrared sensor 91 into a current change and a voltage change in this order, and finally converts it into a signal of voltage that can be easily treated to output the signal. The signal conversion circuit 92 is configured using an operational amplifier, for example. The amplifier circuit 93 amplifies a voltage signal output from the signal conversion circuit 92 to output it to the A/D converter 94. The A/D converter 94 converts the voltage signal amplified by the amplifier circuit 93 into a digital signal.

The temperature conversion unit 95 and the characteristic value calculation unit 96 each are a function processing unit that serves when a CPU (not shown) of the high-speed radiation thermometer unit 90 executes a predetermined processing program. The temperature conversion unit 95 performs predetermined calculation processing on a signal output from the A/D converter 94, or a signal indicating intensity of infrared light received by the infrared sensor 91, to convert it into temperature. Temperature obtained by the temperature conversion unit 95 is a temperature of an upper surface of a semiconductor wafer W. The infrared sensor 91, the signal conversion circuit 92, the amplification circuit 93, the A/D converter 94, and the temperature conversion unit 95 constitute the upper radiation thermometer 25. While the lower radiation thermometer 20 also has substantially the same configuration as the upper radiation thermometer 25, it does not have to be suitable for high-speed measurement.

The temperature conversion unit 95 stores acquired temperature data in the storage unit 97. As the storage unit 97, a publicly known storage medium, such as a magnetic disk and a memory, is available. The temperature conversion unit 95 sequentially accumulates temperature data sampled at predetermined intervals in the storage unit 97 to acquire a temperature profile indicating a temporal change in temperature of an upper surface of a semiconductor wafer W.

As shown in FIG. 8, the high-speed radiation thermometer unit 90 is electrically connected to the controller 3 that is a controller of the entire heat treatment apparatus 1. The controller 3 includes a crack determination unit 31. The crack determination unit 31 is a function processing unit that serves when the CPU of the controller 3 executes a predetermined processing program. Processing contents of the characteristic value calculation unit 96 of the high-speed radiation thermometer unit 90, and of the crack determination unit 31 of the controller 3, will be described later.

In addition, the controller 3 is connected to a display unit 32 and an input unit 33. The controller 3 causes the display unit 32 to display various kinds of information. The input unit 33 is a device for an operator of the heat treatment apparatus 1 to input various commands and parameters to the controller 3. The operator can also set conditions of a treatment recipe describing treatment conditions of a semiconductor wafer W from the input unit 33. As the display unit 32 and the input unit 33, a liquid crystal touch panel provided on an outer wall of the heat treatment apparatus 1 is available, for example.

The heat treatment apparatus 1 further includes, in addition to the aforementioned components, various cooling structures to prevent an excessive temperature rise in the halogen heating part 4, the flash heating part 5 and the chamber 6 because of the heat energy generated from the halogen lamps HL and the flash lamps FL during the heat treatment of a semiconductor wafer W. As an example, a water cooling tube (not shown) is provided in the walls of the chamber 6. In addition, the halogen heating part 4 and the flash heating part 5 have an air cooling structure for forming a gas flow therein to exhaust heat. Air is supplied to a gap between the upper chamber window 63 and the lamp light radiation window 53 to cool down the flash heating part 5 and the upper chamber window 63.

Subsequently, a treatment procedure for a semiconductor wafer W in the heat treatment apparatus 1 will be described. FIG. 9 is a flowchart showing a treatment procedure of a semiconductor wafer W. The semiconductor wafer W to be treated is a semiconductor substrate into which impurities (ions) are added by an ion implantation method. The impurities are activated by heat treatment (annealing) by emission of a flash of light, performed by the heat treatment apparatus 1. A procedure for the treatment in the heat treatment apparatus 1 to be described below proceeds under the control of the controller 3 over the operating mechanisms of the heat treatment apparatus 1.

First, the valve 84 for gas supply is opened and the valves 89 and 192 for exhaust are opened to start ventilation in the chamber 6. When the valve 84 is opened, nitrogen gas is supplied into the heat treatment space 65 through the gas supply opening 81. In addition, when the valve 89 is opened, gas in the chamber 6 is exhausted through the gas exhaust opening 86. This causes the nitrogen gas supplied from an upper portion of the heat treatment space 65 of the chamber 6 to flow downward to be discharged from a lower portion of the heat treatment space 65.

The gas within the chamber 6 is exhausted also through the transport opening 66 by opening the valve 192. In addition, the exhaust mechanism (not shown) exhausts an atmosphere near the drivers of the transfer mechanism 10. When heat treatment is applied to the semiconductor wafer W in the heat treatment apparatus 1, nitrogen gas is continuously supplied into the heat treatment space 65. The amount of the supply is appropriately changed depending on a treatment step.

Subsequently, the gate valve 185 is opened to open the transport opening 66. A transport robot outside the heat treatment apparatus 1 transfers a semiconductor wafer W to be treated into the heat treatment space 65 of the chamber 6 through the transport opening 66 (step S1). While at this time, an atmosphere outside the apparatus may be sucked when the semiconductor wafer W is transferred, nitrogen gas being continuously supplied into the chamber 6 flows out through the transport opening 66 to enable reduction in suction of an external atmosphere as much as possible.

The semiconductor wafer W transferred into the heat treatment space 65 by the transport robot is moved forward to a position lying immediately over the holder 7 and is stopped thereat. Then, the pair of transfer arms 11 of the transfer mechanism 10 is moved horizontally from the retracted position to the transfer operation position and is then moved upwardly, whereby the lift pins 12 pass through the through holes 79 and protrude from the upper surface of the holding plate 75 of the susceptor 74 to receive the semiconductor wafer W. At this time, the lift pins 12 move upwardly to above the upper ends of the substrate support pins 77.

After the semiconductor wafer W is placed on the lift pins 12, the transport robot moves out of the heat treatment space 65, and the gate valve 185 closes the transport opening 66. Then, the pair of transfer arms 11 moves downwardly to transfer the semiconductor wafer W from the transfer mechanism 10 to the susceptor 74 of the holder 7, so that the semiconductor wafer W is held from below in a horizontal attitude from below. The semiconductor wafer W is supported by the substrate support pins 77 provided upright on the holding plate 75, and is held by the susceptor 74. The semiconductor wafer W is held by the holder 7 such that its front surface into which pattern is formed and impurities are implanted faces upward. A predetermined distance is defined between the back surface (a main surface opposite from the front surface) of the semiconductor wafer W supported by the substrate support pins 77 and the holding surface 75a of the holding plate 75. The pair of transfer arms 11 moved downwardly below the susceptor 74 is moved back to the retracted position, i.e. to the inside of the recessed portion 62, by the horizontal movement mechanism 13.

The semiconductor wafer W is held from below by the susceptor 74 made of quartz of the holder 7 in a horizontal attitude, and then the 40 halogen lamps HL of the halogen heating part 4 light up all together to start preliminary heating (assist heating) (step S2). Halogen light emitted from the halogen lamps HL is transmitted through the lower chamber window 64 and the susceptor 74 both made of quartz, and impinges upon the lower surface of the semiconductor wafer W. When light irradiation from the halogen lamps HL is received, the semiconductor wafer W is preliminary heated to be increased in temperature. The transfer arms 11 of the transfer mechanism 10 are retracted to the inside of the recessed portion 62, and thus do not become an obstacle to heating using the halogen lamps HL.

The lower radiation thermometer 20 measures temperature of a semiconductor wafer W when the halogen lamps HL perform preliminary heating. Specifically, the lower radiation thermometer 20 receives infrared light emitted from a lower surface of a semiconductor wafer W held by the susceptor 74 through the opening 78, the infrared light passing through the transparent window 21, to measure temperature of the semiconductor wafer W increasing in temperature. The measured temperature of the semiconductor wafer W is transmitted to the controller 3. The controller 3 controls the output from the halogen lamps HL while monitoring whether the temperature of the semiconductor wafer W increasing in temperature by the irradiation with light from the halogen lamps HL reaches a predetermined preliminary heating temperature T1 or not. In other words, the controller 3 effects feedback control of the output from the halogen lamps HL so that the temperature of the semiconductor wafer W is equal to the preliminary heating temperature T1 based on the value measured with the lower radiation thermometer 20. As described above, the lower radiation thermometer 20 is a radiation thermometer for temperature control of a semiconductor wafer W during preliminary heating. The preliminary heating temperature T1 is set to a temperature within a range from 200° C. to 800° C., preferably from 350° C. to 600° C., where impurities added to the semiconductor wafer W may not be diffused by heat (600° C. in the present preferred embodiment).

After the temperature of the semiconductor wafer W reaches the preliminary heating temperature T1, the controller 3 maintains the temperature of the semiconductor wafer W at the preliminary heating temperature T1 for a while. Specifically, when the temperature of the semiconductor wafer W measured with the lower radiation thermometer 20 reaches the preliminary heating temperature T1, the controller 3 controls the output from the halogen lamps HL to maintain the temperature of the semiconductor wafer W at approximately the preliminary heating temperature T1.

When the preliminary heating using the halogen lamps HL as described above is performed, the entire semiconductor wafer W is uniformly increased in temperature to the preliminary heating temperature T1. In the stage of the preliminary heating using the halogen lamps HL, the semiconductor wafer W shows a tendency to be lower in temperature in a peripheral portion thereof where heat dissipation is liable to occur than in a central portion thereof. However, the halogen lamps HL in the halogen heating part 4 are disposed at a higher density in the region opposed to the peripheral portion of the semiconductor wafer W than in the region opposed to the central portion thereof. This causes a greater amount of light to impinge upon the peripheral portion of the semiconductor wafer W where heat dissipation is liable to occur, so that in-plane temperature distribution of the semiconductor wafer W in the stage of the preliminary heating can be uniform.

After temperature of the semiconductor wafer W reaches the preliminary heating temperature T1, the upper radiation thermometer 25 starts to measure temperature of the front surface of the semiconductor wafer W immediately before the flash lamps FL each emit a flash of light (step S3). Infrared light with intensity suitable for the temperature is emitted from the front surface of the semiconductor wafer W being heated. Infrared light emitted from the front surface of the semiconductor wafer W passes through the transparent window 26 and is received by the infrared sensor 91 of the upper radiation thermometer 25.

An InSb optical element of the infrared sensor 91 has a resistance change according to the intensity of the received infrared light. The resistance change generated in the InSb optical element of the infrared sensor 91 is converted into a voltage signal by the signal conversion circuit 92. The voltage signal output from the signal conversion circuit 92 is amplified by the amplifier circuit 93, and then converted into a digital signal, suitable for being treated by a computer, by the A/D converter 94. Then, the temperature conversion unit 95 performs predetermined calculation processing on the signal output from the A/D converter 94 and converts it into temperature data. That is, the upper radiation thermometer 25 receives infrared light emitted from a front surface of a semiconductor wafer W being heated, and measures temperature of the front surface of the semiconductor wafer W from intensity of the infrared light.

In the present preferred embodiment, the upper radiation thermometer 25 is a high-speed radiation thermometer using an InSb optical element, and the upper radiation thermometer 25 measures temperature of a front surface of a semiconductor wafer W at an extremely short sampling interval of 40 microseconds. The upper radiation thermometer 25 sequentially accumulates data on the temperature of the front surface of the semiconductor wafer W, measured at predetermined intervals, in the storage unit 97.

At the time when a predetermined time elapses after temperature of a semiconductor wafer W held on the susceptor 74 reaches the preliminary heating temperature T1, the flash lamps FL of the flash heating part 5 irradiates a front surface of the semiconductor wafer W with a flash of light (step S4). At this time, a part of a flash of light emitted from each of the flash lamps FL directly radiates into the chamber 6, and the other thereof radiates into the chamber 6 after being reflected once by the reflector 52, and then flash heating of the semiconductor wafer W is performed by emission of these flashes of light.

The flash heating is performed by emission of a flash of light from each of the flash lamps FL, so that temperature of the front surface of the semiconductor wafer W can be increased in a short time. In other words, a flash of light emitted from each of the flash lamps FL is an extremely-short and intensive flash acquired by converting electrostatic energy preliminarily accumulated in a capacitor into an extremely short optical pulse of irradiation time of the order of not less than 0.1 milliseconds and not more than 100 milliseconds. Then, temperature of the front surface of the semiconductor wafer W irradiated with a flash of light from each of the flash lamps FL for flash heating momentarily increases to a treatment temperature T2 of 1000° C. or more, and rapidly decreases after impurities implanted into the semiconductor wafer W are activated. As described above, the heat treatment apparatus 1 can increase and decrease temperature of a front surface of a semiconductor wafer W in an extremely short time, so that impurities implanted into the semiconductor wafer W can be activated while thermal diffusion of the impurities is suppressed. A time required for activation of the impurities is extremely short as compared with a time required for thermal diffusion thereof, so that the activation is completed even in a short time of the order of from 0.1 milliseconds to 100 milliseconds, where no diffusion occurs.

Even when temperature of a front surface of a semiconductor wafer W rapidly increases due to flash heating and decreases, the upper radiation thermometer 25 measures temperature of the front surface thereof. The upper radiation thermometer 25 measures temperature of a front surface of a semiconductor wafer W at an extremely short sampling interval of 40 microseconds, and thus can follow change in temperature even if temperature of a front surface of a semiconductor wafer W suddenly changes during irradiation of a flash of light. For example, even if temperature of a front surface of a semiconductor wafer W increases or decrease in 4 milliseconds, the upper radiation thermometer 25 can acquire temperature data of 100 points during that time. The upper radiation thermometer 25 measures temperature of a front surface of a semiconductor wafer W, for a predetermined period (e.g., 120 milliseconds) after the flash lamps FL each emit a flash of light, to acquire temperature data. Then, the upper radiation thermometer 25 sequentially accumulates the acquired data on the temperature of the front surface of the semiconductor wafer W in the storage unit 97. As a result, a temperature profile of the temperature of the front surface of the semiconductor wafer W during irradiation of a flash of light is created (step S5).

Figure 10:
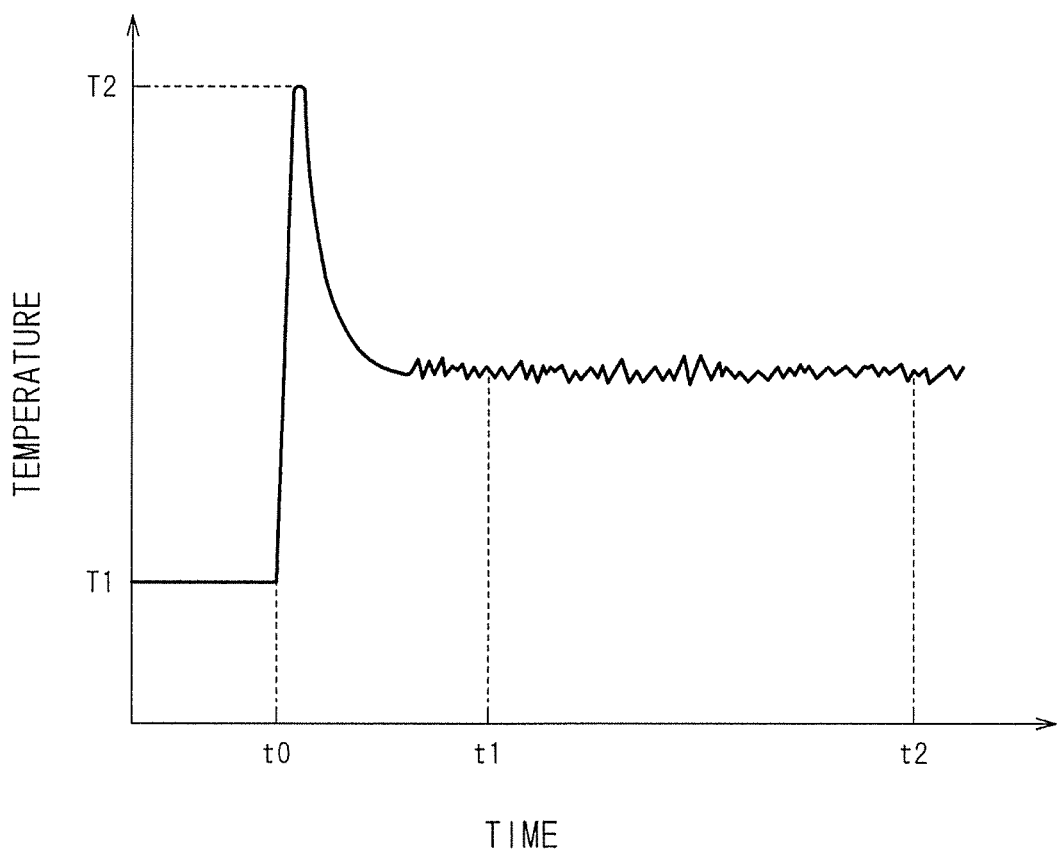
FIG. 10 is a graph showing an example of a temperature profile of temperature of a front surface of a semiconductor wafer during irradiation of a flash of light.

FIG. 10 is a graph showing an example of a temperature profile of temperature of a front surface of a semiconductor wafer W during irradiation of a flash of light. FIG. 10 shows an example of the temperature profile when the flash heating treatment is normally performed without cracking a semiconductor wafer W during irradiation of a flash of light. The flash lamps FL each emit light at time t0 to irradiate a front surface of a semiconductor wafer W with a flash of light, so that temperature of the front surface of the semiconductor wafer W instantaneously increases from the preliminary heating temperature T1 to the treatment temperature T2, and then rapidly decreases. After that, as shown in FIG. 10, the measured temperature of the front surface of the semiconductor wafer W fluctuates with minute amplitude. It is conceivable that such a small fluctuation of the measured temperature is caused by vibration of the semiconductor wafer W on the susceptor 74 after the semiconductor wafer W is irradiated with a flash of light. That is, during irradiation of a flash of light, a front surface of a semiconductor wafer W is irradiated with the flash of light having a very short irradiation time and high energy, so that while temperature of the front surface of the semiconductor wafer W instantaneously increases to the treatment temperature T2 of 1000° C. or more, temperature of a back surface thereof at the moment does not increase considerably from the preliminary heating temperature T1. This causes rapid thermal expansion only on the front surface of the semiconductor wafer W, and little thermal expansion on the back surface, so that the semiconductor wafer W momentarily warps so as to be convex on the front surface. At the next moment, the semiconductor wafer W deforms so that the warp returns, and such behaviors are repeated to cause the semiconductor wafer W to vibrate on the susceptor 74. The infrared sensor 91 of the upper radiation thermometer 25 is provided obliquely above the semiconductor wafer W, so that emissivity of the front surface of the wafer as seen from the infrared sensor 91 fluctuates when the semiconductor wafer W vibrates. As a result, temperature measured by the upper radiation thermometer 25 slightly fluctuates. Although the measured temperature by the upper radiation thermometer 25 fluctuates due to the vibration of the semiconductor wafer W, actual temperature of the front surface of the semiconductor wafer W does not fluctuate.

When the flash heating treatment is normally performed without causing a semiconductor wafer W to be cracked during irradiation of a flash of light, a temperature profile as shown in FIG. 10 can be obtained with high reproducibility. Meanwhile, when a crack occurs in the semiconductor wafer W during irradiation of a flash of light, abnormal measurement data appears in a temperature profile. Thus, in the first preferred embodiment, a crack of the semiconductor wafer W is detected by statistically analyzing a temperature profile to identify abnormal measurement data.

After the flash heating treatment is finished, the characteristic value calculation unit 96 calculates a characteristic value from the created temperature profile (step S6). The characteristic value is a statistic when statistical processing is applied to the temperature profile, and an average value and a standard deviation of the temperature profile are each used as the characteristic value in the present preferred embodiment. Specifically, the characteristic value calculation unit 96 calculates each of the average value and the standard deviation of the temperature profile within a period from time t1 to time t2 as the characteristic value. Time t1 being a beginning of a calculation period is a time after 30 milliseconds elapse from time t0 at which the flash lamps FL emits light, for example. Time t1 being the beginning of the calculation period of time is delayed from time t0 at which the flash lamps FL emit light, because a characteristic value is affected when the calculation period includes increase and decrease in temperature of a front surface of a semiconductor wafer W by flash heating. Time t2 being an end of the calculation period is a time after 100 milliseconds elapse from time t0 at which the flash lamps FL emit light, for example. Thus, the calculation period (t2-t1) in which the characteristic value calculation unit 96 calculates the characteristic value is 70 milliseconds, and is a period in which temperature of the front surface of the semiconductor wafer W is stabilized after the front surface is irradiated with a flash of light.

Figure 11:
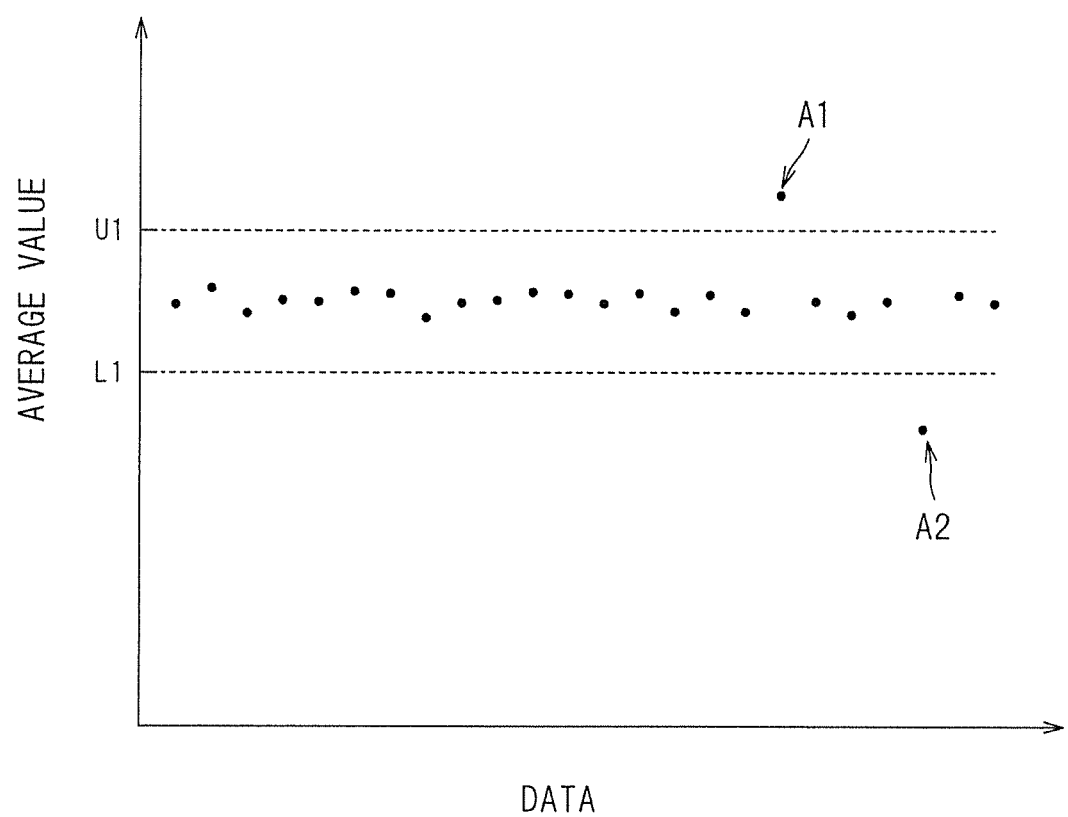
FIG. 11 is a graph for explaining crack determination based on an average value of a temperature profile.

Next, the crack determination unit 31 of the controller 3 determines cracking of the semiconductor wafer W based on the characteristic value calculated by the characteristic value calculation unit 96 (step S7). The crack determination unit 31 determines whether or not the characteristic value of the temperature profile is out of a predetermined range to perform crack determination. FIG. 11 is a graph for explaining crack determination based on an average value of a temperature profile. FIG. 11 shows plotted average values of respective temperature profiles created by irradiating a plurality of semiconductor wafers W each with a flash of light. As with the above description, the average value of the temperature profile is an average value of a temperature profile in the calculation period from time t1 to time t2, and hereinafter is also referred to as a "profile average value".

The horizontal axis of FIG. 11 shows data points for each of a plurality of semiconductor wafers W, and the vertical axis of FIG. 11 shows average values of respective temperature profiles. An upper control limit value U1 is obtained by adding a value five times a standard deviation a of profile average values of a plurality of semiconductor wafers W to a total average of the profile average values of the plurality of semiconductor wafers W. Meanwhile, a lower control limit value L1 is obtained by subtracting the value five times the standard deviation a of the profile average values of the plurality of semiconductor wafers W from the total average of the profile average values of the plurality of semiconductor wafers W. That is, a range defined by dotted lines in FIG. 11 shows a range of ±5σ from the total average of the profile average values.

When an average value of temperature profiles obtained by irradiating a semiconductor wafer W with a flash of light falls within the range of ±5σ from the total average of profile average values, the crack determination unit 31 determines that the semiconductor wafer W is not cracked. When the average value of the temperature profiles is out of the range, the crack determination unit 31 determines that the semiconductor wafer W is cracked. In an example shown in FIG. 11, an average profile value of the semiconductor wafer W indicated by a data point A1 is larger than the upper control limit value U1. In addition, an average profile value of the semiconductor wafer W indicated by a data point A2 is smaller than the lower control limit value L1. That is, the profile average values of semiconductor wafers W indicated by the corresponding data points A1 and A2 are out of the range of ±5σ from the total average of the profile average values, so that the crack determination unit 31 determines that the two semiconductor wafers W are cracked.

Meanwhile, FIG. 12 is a graph for explaining crack determination based on a standard deviation of a temperature profile. FIG. 12 shows plotted standard deviations of respective temperature profiles created by irradiating a plurality of semiconductor wafers W each with a flash of light. As with the above description, the standard deviation of the temperature profile is a standard deviation of a temperature profile in the calculation period from time t1 to time t2, and hereinafter is also referred to as a "profile standard deviation".

The horizontal axis of FIG. 12 shows data points for each of a plurality of semiconductor wafers W, and the vertical axis of FIG. 12 shows standard deviations of respective temperature profiles. An upper control limit value U2 is obtained by adding a value five times a standard deviation a of profile standard deviations of a plurality of semiconductor wafers W to a total average of the profile standard deviations of the plurality of semiconductor wafers W. That is, a range below a dotted line in FIG. 12 shows a range of 5σ from the total average of the profile standard deviations. The profile standard deviation is zero when fluctuation of measured temperatures is the least, so that there is no concept of a lower control limit value.

When a standard deviation of temperature profiles obtained by irradiating a semiconductor wafer W with a flash of light falls within the range of 5σ from the total average of profile standard deviations, the crack determination unit 31 determines that the semiconductor wafer W is not cracked. When the standard deviation of temperature profiles is out of the range, the crack determination unit 31 determines that the semiconductor wafer W is cracked. In an example shown in FIG. 12, a profile standard deviation of the semiconductor wafer W indicated by a data point B1 is larger than the upper control limit value U2. That is, the profile standard deviation of semiconductor wafers W indicated by the data point B1 is out of the range of 5σ from the total average of the profile standard deviations, so that the crack determination unit 31 determines that the semiconductor wafer W is cracked.

The crack determination unit 31 also performs "OR determination" on two characteristic values of an average value and a standard deviation. That is, when an average value of temperature profiles of a certain semiconductor wafer W is out of the range of ±5σ from a total average of profile average values, or when a standard deviation of the temperature profiles is out of the range of 5σ from a total average of profile standard deviations, the crack determination unit 31 determines that the semiconductor wafer W is cracked. This is because, in determination of only one of the characteristic values, it may be determined that a semiconductor wafer W is not cracked even though the semiconductor wafer W is actually cracked. For example, when a measured temperature after irradiation of a flash of light becomes a stable temperature remarkably higher (or lower) than usual, as a result of cracking in a semiconductor wafer W, it is determined that the semiconductor wafer W is cracked by determination using an average value, but it may be determined that the semiconductor wafer W is not cracked by determination using a standard deviation. Conversely, when the measured temperature after the flash of light irradiation greatly varies up and down across the normal temperature as a result of cracking in the semiconductor wafer W, it is determined that it is cracked by determination using a standard deviation, but it may be determined that it is not cracked by determination using an average value. Thus, when the "OR determination" is performed on an average value and a standard deviation, accuracy of crack detection can be improved.

Returning back to FIG. 9, when the crack determination unit 31 determines that a semiconductor wafer W after irradiation of a flash of light is cracked, processing proceeds to step S9 from step S8. Then, the controller 3 interrupts the treatment in the heat treatment apparatus 1, and also stops operation of a transfer system for transferring a semiconductor wafer W to and from the chamber 6. In addition, the controller 3 may issue a warning of occurrence of wafer cracking to the display unit 32. When a crack of the semiconductor wafer W occurs, particles are generated in the chamber 6, and thus the chamber 6 is opened so that cleaning operation is performed.

Meanwhile, when the crack determination unit 31 determines that a semiconductor wafer W after irradiation of a flash of light is not cracked, processing proceeds to step S10 from step S8 so that the semiconductor wafer W is transferred out. Specifically, after flash heating treatment is finished, the halogen lamps HL each are tuned off after elapse of a predetermined time. This causes the semiconductor wafer W to sharply decrease in temperature from the preliminary heating temperature T1. The lower radiation thermometer 20 measures the temperature of the semiconductor wafer W decreasing in temperature, and the result of measurement is transmitted to the controller 3. The controller 3 monitors whether or not the temperature of the semiconductor wafer W is decreased to a predetermined temperature based on the result of measurement with the lower radiation thermometer 20. After the temperature of the semiconductor wafer W is decreased to the predetermined temperature or below, the pair of transfer arms 11 of the transfer mechanism 10 is moved horizontally again from the retracted position to the transfer operation position and is then moved upwardly, so that the lift pins 12 protrude from the upper surface of the susceptor 74 to receive the heat-treated semiconductor wafer W from the susceptor 74. Subsequently, the transport opening 66 which has been closed is opened by the gate valve 185, and the transport robot outside the heat treatment apparatus 1 transfers the semiconductor wafer W placed on the lift pins 12 to the outside. Thus, the heat treatment apparatus 1 completes the heating treatment of the semiconductor wafer W.

In the present preferred embodiment, temperature of a front surface of a semiconductor wafer W after irradiation of a flash of light is measured by the upper radiation thermometer 25 to acquire temperature profiles, and when an average value of the temperature profiles is out of the range of ±5σ from a total average of profile average values, or when a standard deviation of the temperature profiles is out of the range of 5σ from a total average of profile standard deviations, it is determined that the semiconductor wafer W is cracked. That is, a crack of the semiconductor wafer W during irradiation of a flash of light is detected with a simple structure without adding a special hardware structure for wafer crack detection to the heat treatment apparatus 1. In addition, a crack of the semiconductor wafer W is detected through a simple statistical calculation process, there is no concern of reducing throughput.

Further, in the present preferred embodiment, the "OR determination" is performed on an average value and a standard deviation of a temperature profile, so that a crack of a semiconductor wafer W during irradiation of a flash of light can be detected with high accuracy.

In the present preferred embodiment, the upper radiation thermometer 25 has a measurement wavelength range of 5 μm or more to 6.5 μm or less. That is, the upper radiation thermometer 25 measures temperature of a front surface of a semiconductor wafer W from intensity of infrared light having a wavelength from 5 μm to 6.5 μm emitted from the front surface of the semiconductor wafer W. Regardless of occurrence of a crack in the semiconductor wafer W, a large fluctuation does not occur in temperature itself of the front surface of the semiconductor wafer W. It is conceivable that abnormal measurement data appears in a temperature profile when a crack occurs in the semiconductor wafer W because a cracked fragment has behavior (physical movement) different from that in a normal state. Specifically, an angle formed between the optical axis of the upper radiation thermometer 25 and a cracked fragment is different from that in a normal state, so that apparent emissivity of a semiconductor wafer W changes greatly to result in acquiring abnormal measurement data. Thus, to accurately detect a crack, temperature measurement by the upper radiation thermometer 25 needs to be sensitive to change in angle with respect to the semiconductor wafer W. Meanwhile, various patterns and thin films are formed on a front surface of a semiconductor wafer W in many cases. While emissivity of a semiconductor wafer W is also affected by these patterns and thin films, it is preferable that the temperature measurement by the upper radiation thermometer 25 be less likely to be affected by change in patterns and film types from a viewpoint of crack detection.

Figure 13:
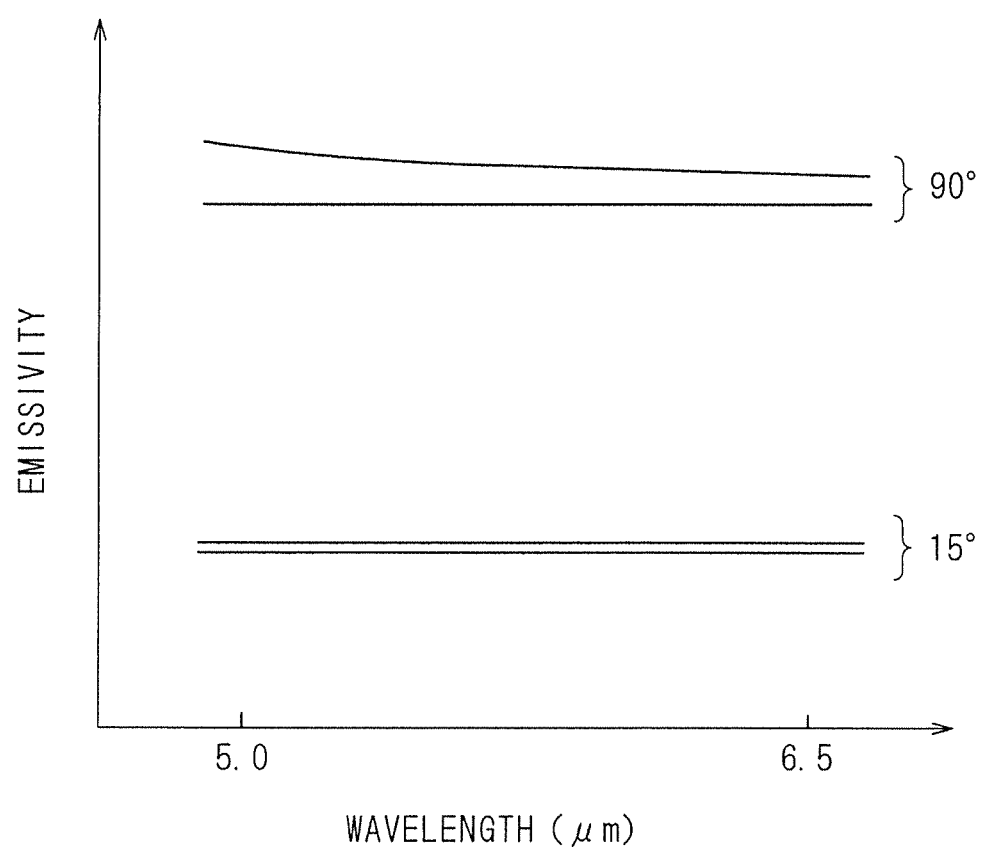
FIG. 13 is a graph showing influence of an angle formed by an optical axis of an upper radiation thermometer and a main surface of a semiconductor wafer on apparent emissivity of the semiconductor wafer.

FIG. 13 is a graph showing influence of an angle formed by an optical axis of the upper radiation thermometer 25 and a main surface of a semiconductor wafer W on apparent emissivity of the semiconductor wafer W. FIG. 13 shows apparent emissivity of each of angles of 15° and 90°, formed by the optical axis of the upper radiation thermometer 25 and the main surface of the semiconductor wafer W, the angles being acquired by forming two types of thin film each having a different thicknesses on an upper surface of a semiconductor wafer W. In addition, FIG. 13 shows the apparent emissivity of the semiconductor wafer W in the measurement wavelength range (5 μm to 6.5 μm) of the upper radiation thermometer 25.

As shown in FIG. 13, when the angle formed by the optical axis of the upper radiation thermometer 25 and the main surface of the semiconductor wafer W changes in the wavelength range of 5 µm or more and 6.5 µm or less, the apparent emissivity largely changes. This indicates that the temperature measurement by the upper radiation thermometer 25 is sensitive to the change in angle with respect to the semiconductor wafer W in the range of the measurement wavelength range of the upper radiation thermometer 25. Thus, if an angle between a cracked fragment caused by cracking in the semiconductor wafer W and the upper radiation thermometer 25 is slightly different from that in a normal state, apparent emissivity changes to acquire abnormal measurement data. As a result, a crack of the semiconductor wafer W is detected with high accuracy. In contrast, influence of thickness of a thin film on the emissivity is small as compared with the influence of the angle change. This indicates that the temperature measurement by the upper radiation thermometer 25 is less sensitive to change in patterns and film types. That is, it is preferable that the measurement wavelength range of the upper radiation thermometer 25 be 5 µm or more and 6.5 µm or less to achieve both elimination of influence of patterns and film types and sensitivity to change in angle.

In the present preferred embodiment, the upper radiation thermometer 25 is provided obliquely above a semiconductor wafer W, and an angle formed by the optical axis of the upper radiation thermometer 25 and a main surface of the semiconductor wafer W is relatively small. Thus, a detection area of the upper radiation thermometer 25 extends over a relatively large area on the upper surface of the semiconductor wafer W, so that a crack in the semiconductor wafer W is easily detected.

Second Preferred Embodiment

Next, a second preferred embodiment according to the present invention will be described. A heat treatment apparatus 1 according to the second preferred embodiment is exactly identical in configuration with that according to the first preferred embodiment. A procedure for treatment of a semiconductor wafer W in the heat treatment apparatus 1 according to the second preferred embodiment is also substantially similar to that according to the first preferred embodiment. The second preferred embodiment is different from the first preferred embodiment in a calculation period of a characteristic value in a temperature profile.

In the second preferred embodiment, time t0 in FIG. 10 at which flash lamps FL each start emitting a flash of light is set as a beginning of the calculation period. That is, in the second preferred embodiment, a predetermined period after start of irradiation of a flash of light is set as the calculation period, and thus increase and decrease in temperature of a front surface of a semiconductor wafer W by flash heating is included in the calculation period of a characteristic value. A method for calculating the characteristic value and a method for determining a crack of the semiconductor wafer W based on the characteristic value are the same as those in the first preferred embodiment. When an average value of temperature profiles including a period of irradiation of a flash of light is out of the range of ±5σ from a total average of profile average values or when a standard deviation of the temperature profiles is out of the range of 5σ from a total average of profile standard deviations, it is determined that a semiconductor wafer W is cracked.

As is clear from FIG. 10, increase and decrease in temperature of a front surface of a semiconductor wafer W due to flash heating greatly affect a characteristic value such as an average value and a standard deviation of temperature profiles. However, when the semiconductor wafer W is normally treated without being cracked, a pattern of increase and decrease in temperature of a front surface of a semiconductor wafer W due to flash heating has high reproducibility, and thus a characteristic value itself of a temperature profile is stable (a standard deviation of the characteristic value is as small as the first preferred embodiment). Thus, as with the first preferred embodiment, when a crack occurs in a semiconductor wafer W and abnormal measurement data appears in a temperature profile, a characteristic value of the temperature profile is out of a predetermined range. This enables crack determination of a semiconductor wafer W by determining whether or not a characteristics value of a temperature profile is out of a predetermined range.

Further, in the second preferred embodiment, a period of irradiation of a flash of light is also included in a calculation period of a characteristic value, so that even when abnormal measurement data is obtained due to cracking in a semiconductor wafer W during the irradiation of a flash of light, the characteristic value of a temperature profile is out of the predetermined range. This enables a crack in a semiconductor wafer W during irradiation of a flash of light to be more reliably detected. Particularly, when irradiation time of the flash lamps FL is relatively long (6 milliseconds or more), a semiconductor wafer W may be cracked during irradiation of a flash of light, and thus it is preferable to include a period of the irradiation of a flash of light in a calculation period of a characteristic value.

From the input unit 33, an operator of the heat treatment apparatus 1 can appropriately input and set whether the calculation period of a characteristic value is set to a predetermined period after irradiation of a flash of light as with the first embodiment, or is set to a predetermined period from a start of the irradiation of a flash of light as with the second embodiment.

Third Preferred Embodiment

Next, a third preferred embodiment according to the present invention will be described. A heat treatment apparatus 1 according to the third preferred embodiment is exactly identical in configuration with that according to the first preferred embodiment. A procedure for treatment of a semiconductor wafer W in the heat treatment apparatus 1 according to the third preferred embodiment is also substantially similar to that according to the first preferred embodiment. The third embodiment is different from the first embodiment in a method for determining a crack of a semiconductor wafer W based on a temperature profile.

As with the first embodiment, an upper radiation thermometer 25 starts measuring temperature of a front surface of a semiconductor wafer W before flash lamps FL each emit a flash of light. Even when temperature of a front surface of a semiconductor wafer W rapidly increases after the flash lamps FL start flash irradiation, the upper radiation thermometer 25 measures temperature of the front surface thereof. As described above, the upper radiation thermometer 25 measures temperature of a front surface of a semiconductor wafer W at an extremely short sampling interval of 40 microseconds, and thus can follow change in temperature even if temperature of a front surface of a semiconductor wafer W suddenly changes during irradiation of a flash of light. The upper radiation thermometer 25 sequentially accumulates acquired data on temperature of the front surface of the semiconductor wafer W in a storage unit 97.

As a result, a temperature profile of the temperature of the front surface of the semiconductor wafer W during irradiation of a flash of light is created.

Figure 14:
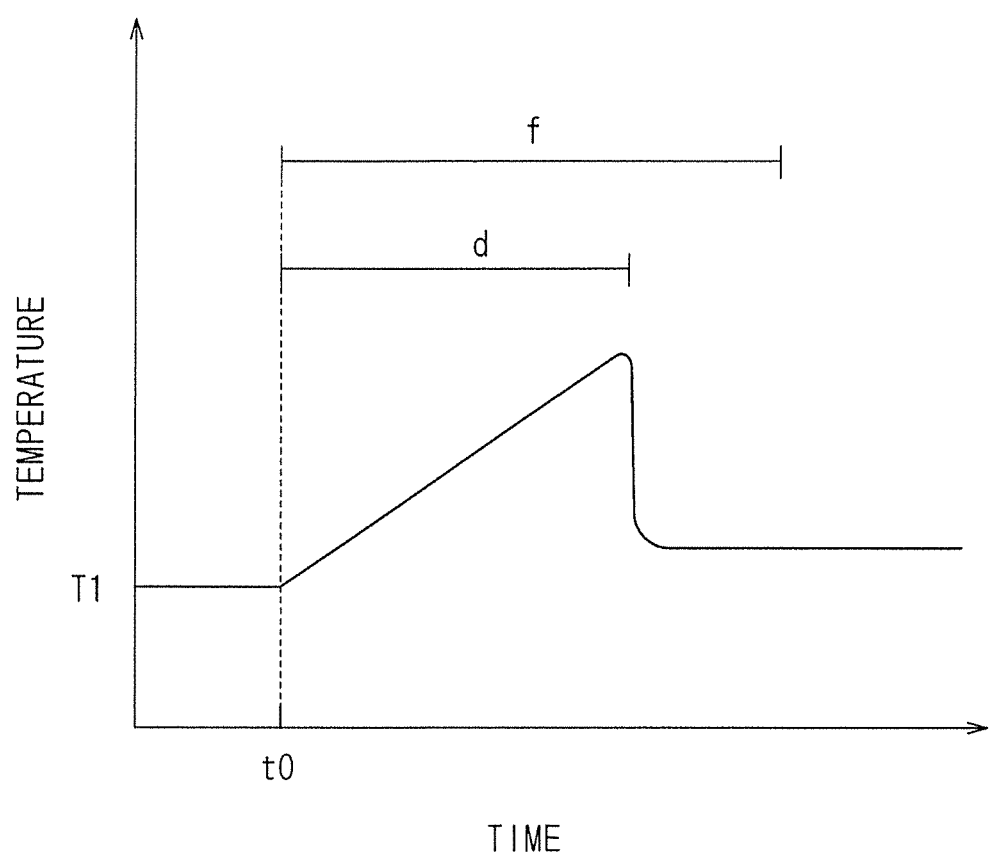
FIG. 14 is a graph for explaining crack determination based on temperature rise duration of a semiconductor wafer.

In the third embodiment, a crack of a semiconductor wafer W is determined based on time during which temperature of a front surface of the semiconductor wafer W continuously increases after the flash lamps FL each start emitting a flash of light. FIG. 14 is a graph for explaining crack determination based on temperature rise duration of a semiconductor wafer W. As with FIG. 10, FIG. 14 shows a temperature profile of temperature of a front surface of a semiconductor wafer W during irradiation of a flash of light. The temperature of the front surface of the semiconductor wafer W starts to increase from a preliminary heating temperature T1 almost at the same time when the flash lamps FL each emit light at time t0 to start irradiation of a flash of light. When flash heating treatment is normally performed without cracking a semiconductor wafer W during irradiation of a flash of light, a flash irradiation time f (flash time of the flash lamp FL) and a time d during which temperature of a front surface of the semiconductor wafer W continuously increases are almost identical to each other.

However, when a semiconductor wafer W is cracked during irradiation of a flash of light, a deviation occurs between the flash irradiation time f of the flash lamp FL and the time d during which temperature of a front surface of the semiconductor wafer W continuously increases. Normally, as shown in FIG. 14, the temperature rise duration d of temperature of a front surface of a semiconductor wafer W is shorter than the flash irradiation time f. In the third preferred embodiment, a crack determination unit 31 determines that a semiconductor wafer W is cracked when the time d, during which temperature of a front surface of the semiconductor wafer W continuously increases after irradiation of a flash of light is started, deviates from the flash irradiation time f of the flash lamp FL by a predetermined value or more. For example, when the temperature rise duration d deviates from the flash irradiation time f by ±10% or more, it is determined that a semiconductor wafer W is cracked.

In the third preferred embodiment, a crack of a semiconductor wafer W during irradiation of a flash of light is detected from only a temperature profile of temperature of a front surface of the semiconductor wafer W to be treated. Thus, as with the first preferred embodiment, there is an unnecessary process of creating temperature profiles of a large number of semiconductor wafers W to acquire a control limit value by calculating a characteristic value of the temperature profile.

The flash irradiation time f of the flash lamp FL can be adjusted by incorporating an insulated gate bipolar transistor (IGBT) in a circuit of the flash lamp FL to apply on-off control of energization to the flash lamp FL, or by changing a coil constant of a lamp power source for supplying electric power to the flash lamp FL. As described above, when the flash irradiation time f is relatively increased (6 milliseconds or more), a semiconductor wafer W may be cracked during irradiation of a flash of light.

A crack determination method of the third preferred embodiment is suitable for such a case.

Modification

While the preferred embodiments according to the present invention are described above, various modifications of the present invention in addition to those described above may be made without departing from the scope and spirit of the invention. For example, while an average value and a standard deviation are used as characteristic values of a temperature profile in each of the above embodiments, the invention is not limited thereto, and other statistics may be used. As the characteristic value of the temperature profile, a median value may be used instead of the average value, and a range being a difference between a maximum value and a minimum value may be used instead of the standard deviation, for example.

In addition, as the characteristic value of the temperature profile, a maximum value and a minimum value of a waveform of the temperature profile may be used, for example. If the waveform of the temperature profile can be grasped as a periodic sinusoidal wave, a cycle, a frequency, an amplitude, and the like of the wave may be used as the characteristic value. Alternatively, if the waveform of the temperature profile is regarded as a pulse wave, a duty ratio, a full width at half maximum, a half width at half maximum, a maximum inclination, and the like may be used as the characteristic value. In addition, as the characteristic value, an average value, a standard deviation, a median value, a range, a maximum value, and a minimum value of a differentiated waveform obtained by differentiating a temperature profile, and an integral value of a waveform, may be used, for example.

The characteristic value used for determining a wafer crack is not limited to two values, and three or more values of the above-described various characteristic values may be used, or only one characteristic value may be used. While determination accuracy is improved as the number of characteristic values used for wafer crack determination increases, time required for a calculation process increases.

In addition, when a plurality of characteristic values is used for wafer crack determination, the determination is not limited to "OR determination", and determination by another logical operation (e.g., AND, XOR, etc.) is available. However, from a viewpoint of improving determination accuracy, "OR determination" similar to that of each of the above embodiments is preferable.

An operator can appropriately select which characteristic value is to be used for determination of wafer crack from the input unit 33, and set it on the treatment recipe. When a plurality of characteristic values is used, an operator can also select "OR determination" or "AND determination" and set it from the input unit 33. As a result, even when the characteristic value is changed, remodeling of the heat treatment apparatus 1 every time and upgrading of software are unnecessary.

The control limit value is set to a range of 5σ in each of the above embodiments, but, instead of this, may be set to a range of 3σ that is more general.

A new temperature profile can be obtained each time treatment of a semiconductor wafer W in the heat treatment apparatus 1 is repeated, so that a control limit value used for wafer crack determination may be recalculated and sequentially updated. For example, the control limit value may be calculated based on the latest 10000 temperature profiles for semiconductor wafers W treated under the same treatment condition. As a result, even if a temperature profile changes due to aged deterioration or the like of a device component, an optimum control limit value can be set by following the change.

In addition, a temperature profile obtained by measuring temperature of a front surface of a semiconductor wafer W treated immediately before (or several sheets before) under the same treatment conditions as those of a semiconductor wafer W to be treated is set as a reference temperature profile, and a crack of the semiconductor wafer W may be determined by comparing a temperature profile of the semiconductor wafer W to be treated with the reference temperature profile with. When this method is used, it is assumed that a semiconductor wafer W immediately before (or several wafers before) a semiconductor wafer W to be treated is normally treated without being cracked. This can make it unnecessary to create temperature profiles of a large number of semiconductor wafers W to acquire a control limit value, as with the third preferred embodiment.

Instead of forming a profile of temperature of a front surface of a semiconductor wafer W, a profile of an output value of the infrared sensor 91 (or intensity of infrared light emitted from the front surface of the semiconductor wafer W) before being converted into temperature may be created to be used for wafer crack determination.

Although a detection area (field of view) of the upper radiation thermometer 25 is expanded by disposing the upper radiation thermometer 25 obliquely above a semiconductor wafer W in each of the above preferred embodiments, instead of this, the detection area of the upper radiation thermometer 25 on an upper surface of the semiconductor wafer W may be expanded by increasing a distance between the upper radiation thermometer 25 and the semiconductor wafer W. In addition, a plurality of radiation thermometers may be provided, or a plurality of infrared sensors may be provided in the radiation thermometer, to expand the detection area on the upper surface of the semiconductor wafer W.

Although the 30 flash lamps FL are provided in the flash heating part 5 in each of the above preferred embodiments, the present invention is not limited to this, and any number of flash lamps FL may be provided. The flash lamps FL are not limited to the xenon flash lamps, and may be krypton flash lamps. The number of halogen lamps HL provided in the halogen heating part 4 is also not limited to 40, and any number of halogen lamps HL may be provided.

In each of the above preferred embodiments, although the filament-type halogen lamps HL each are used as a continuous lighting lamp that emits light continuously for not less than one second to preliminary heat a semiconductor wafer W, the present invention is not limited to this, and an arc lamp of a discharge type (e.g., xenon arc lamp) may be used as a continuous lighting lamp in place of the halogen lamp HL to perform preliminary heating.

In each of the above preferred embodiments, although preliminary heating of a semiconductor wafer W is performed by light irradiation from halogen lamps HL, instead of this a susceptor holding a semiconductor wafer W may be mounted on a hot plate to preliminary heat the semiconductor wafer W by heat conduction from the hot plate.

A substrate to be treated by the heat treatment apparatus 1 is not limited to a semiconductor wafer, and may be a glass substrate to be used for a flat panel display such as a liquid crystal display device, and a substrate for a solar cell. The art according to the present invention may be applicable for heat treatment for a high dielectric constant gate insulating film (High-k film), joining between metal and silicon, and crystallization of polysilicon.

While the invention has been shown and described in detail, the foregoing description is in all aspects illustrative and not restrictive. It is therefore understood that numerous modifications and variations can be devised without departing from the scope of the invention.

What is claimed is:

1. A heat treatment method for irradiating a substrate with a flash of light to heat the substrate, the heat treatment method comprising the steps of:

(a) preliminarily heating a substrate using a continuous lighting lamp;
    (b) irradiating a front surface of said substrate with a flash of light from a flash lamp;
    (c) acquiring a temperature profile by measuring temperature of the front surface of said substrate for a predetermined period starting at a beginning of the step (b), wherein the temperature profile for the period includes increase and decrease in temperature of the front surface of said substrate; and
    (d) determining that said substrate is cracked when a characteristic value, calculated from said temperature profile for the period including increase and decrease in temperature of the front surface of the substrate, is out of a predetermined range.

2. The heat treatment method according to claim 1, wherein said step (d) includes a step of selecting and setting said characteristic value.

3. The heat treatment method according to claim 1, wherein in said step (c), temperature of the front surface of said substrate is measured from intensity of infrared light having a wavelength from 5 µm to 6.5 µm emitted from the front surface of said substrate.

4. The heat treatment method according to claim 1, wherein
    an average value and a standard deviation of said temperature profile each serve as said characteristic value, and
    it is determined in said step (d) that said substrate is cracked when an average value of said temperature profile is out of a predetermined range, or a standard deviation of said temperature profile is out of a predetermined range.

5. The heat treatment method according to claim 4, wherein it is determined in said step (d) that said substrate is cracked when an average value of said temperature profile is out of a range of ±5σ, or a standard deviation of said temperature profile exceeds a range of 5σ.

6. A heat treatment apparatus for heating a substrate by irradiating said substrate with a flash of light, the heat treatment apparatus comprising:
    a chamber that houses the substrate;
    a continuous lighting lamp for preliminarily heating said substrate;
    a flash lamp that irradiates a front surface of said substrate housed in said chamber with a flash of light;
    a radiation thermometer that measures temperature of the front surface of said substrate by receiving infrared light emitted from the front surface;
    a profile acquiring unit that acquires a temperature profile of the front surface of said substrate, measured by said radiation thermometer for a predetermined period starting at a beginning of irradiation by said flash lamp, after preliminarily heating said substrate by said continuous lighting lamp, wherein the temperature profile for the period includes increase and decrease in temperature of the front surface of said substrate; and
    an analyzing unit that determines that said substrate is cracked when a characteristic value, calculated from said temperature profile for the period including increase and decrease in temperature of the front surface of the substrate is out of a predetermined range.

7. The heat treatment apparatus according to claim 6, further comprising: a setting unit for setting the characteristic value.

8. The heat treatment apparatus according to claim 6, wherein said radiation thermometer is configured to measure temperature of the front surface of said substrate from intensity of infrared light having a wavelength from 5 μm to 6.5 μm emitted from the front surface of said substrate.

9. The heat treatment apparatus according to claim 6, wherein an average value and a standard deviation of said temperature profile each serve as said characteristic value, and said analyzing unit is configured to determine that said substrate is cracked when an average value of said temperature profile is out of a predetermined range, or a standard deviation of said temperature profile is out of a predetermined range.

10. The heat treatment apparatus according to claim 9, wherein said analyzing unit is configured to determine that said substrate is cracked when an average value of said temperature profile is out of a range of ±5σ, or a standard deviation of said temperature profile exceeds a range of 5σ.

\* \* \* \* \*